(12) United States Patent
Lusted

(10) Patent No.: US 11,683,122 B2
(45) Date of Patent: Jun. 20, 2023

(54) HYBRID PHY WITH INTERLEAVED AND NON-INTERLEAVED RS-FEC AND FEC MODE DETERMINATION DURING ADAPTIVE LINK TRAINING PROTOCOL

(71) Applicant: Intel Corporation, Santa Clara, CA (US)

(72) Inventor: Kent Lusted, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 636 days.

(21) Appl. No.: 16/733,098

(22) Filed: Jan. 2, 2020

(65) Prior Publication Data

US 2020/0153548 A1 May 14, 2020

(51) Int. Cl.
| | |
|---|---|
| *H03M 13/00* | (2006.01) |
| *H04L 1/00* | (2006.01) |
| *H03M 13/17* | (2006.01) |
| *H03M 13/15* | (2006.01) |

(52) U.S. Cl.
CPC ...... *H04L 1/0061* (2013.01); *H03M 13/1515* (2013.01); *H03M 13/17* (2013.01); *H04L 1/0041* (2013.01); *H04L 1/0045* (2013.01); *H04L 1/0071* (2013.01)

(58) Field of Classification Search
CPC ... H04L 1/0061; H04L 1/0041; H04L 1/0071; H04L 1/0045; H03M 13/17; H03M 13/1515

See application file for complete search history.

(56) References Cited

U.S. PATENT DOCUMENTS

| | | | | |
|---|---|---|---|---|
| 7,343,540 B2 * | 3/2008 | Khermosh | ............ | H04L 1/0057 715/781 |
| 2020/0153548 A1 | 5/2020 | Lusted | | |

OTHER PUBLICATIONS

International Search Report and Written Opinion for PCT Patent Application No. PCT/US20/50898, dated May 26, 2021, 8 pages.
(Continued)

*Primary Examiner* — Samir W Rizk
(74) *Attorney, Agent, or Firm* — Compass IP Law PC

(57) ABSTRACT

Apparatus and methods for implementing high-speed Ethernet links using a hybrid PHY (Physical layer) selectively configurable to employ a non-interleaved RS-FEC (Reed Solomon Forward Error Correction) sublayer or an interleaved RS-FEC sublayer. An adaptive link training protocol is used during link training to determine whether to employ the non-interleaved or interleaved RS-FEC during link DATA mode. Training frames are exchanged between link partners including control and status fields used to respectfully request a non-interleaved or interleaved FEC mode and confirm the requested FEC mode is to be used during link DATA mode. The hybrid PHY includes interleaved RS-FEC and non-interleaved RS-FEC sublayers for transmitter and receiver operations. During link training, a determination is made to whether a local receiver is likely to see decision feedback equalizer (DFE) burst errors. If so, the interleaved FEC mode is selected; otherwise the non-interleaved FEC mode is selected or is the default FEC mode. The apparatus and methods may be implemented for 100GBASE-CR1 and 100GBASE-KR1 Ethernet links and interfaces.

25 Claims, 20 Drawing Sheets

(56) References Cited

OTHER PUBLICATIONS

Shawn Nicholl et al: "Baseline Proposal for 4-lane Interleaved IOOG FEC", IEEE Draft; Nicholl 3CK OIA 0519, IEEE-SA, Piscataway, NJ USA, vol. 802.3ck;802.3.100GEL, May 21, 2019 (May 21, 2019), pp. 1-65, Retrieved from the Internet: URL:http://grouper.ieee.org/groups/802/3/c k/public/19 05/3ck 2019MayD.zip.

* cited by examiner

| Bit(s) | Name | Description |
|---|---|---|
| 15:14 | Reserved | Transmit as 0, ignore on receipt |
| 13:12 | Initial condition request | 13 12<br>1　1　= Preset 3<br>1　0　= Preset 2<br>0　1　= Preset 1<br>0　0　= Individual coefficient control |
| 11 | Reserved | Transmit as 0, ignore on receipt |
| 10 | 100G FEC mode request | 0　= 100G FEC mode = non-interleaved<br>1　= 100G FEC mode = interleaved |
| 9:8 | Modulation and precoding request | 9　8<br>1　1　= PAM4 with precoding<br>1　0　= PAM4<br>0　1　= Reserved<br>0　0　= PAM2 |
| 7:5 | Reserved | Transmit as 0, ignore on receipt |
| 4:2 | Coefficient select | 4　3　2<br>1　1　0　= $c(-2)$<br>1　1　1　= $c(-1)$<br>0　0　0　= $c(0)$<br>0　0　1　= $c(1)$ |
| 1:0 | Coefficient request | 1　0<br>1　1　= No equalization<br>1　0　= Decrement<br>0　1　= Increment<br>0　0　= Hold |

Control Field Structure

| Bit(s) | Name | Description |
|---|---|---|
| 15 | Receiver ready | 1 = Training is complete and the receiver is ready for data<br>0 = Request for training to continue |
| 14:12 | Reserved | Transmit as 0, ignore on receipt |
| 11:10 | Modulation and precoding status | 11  10<br>1   1  = PAM4 with precoding<br>1   0  = PAM4<br>0   1  = Reserved<br>0   0  = PAM2 |
| 9 | Receiver frame lock | 1 = Frame boundaries identified<br>0 = Frame boundaries not identified |
| 8 | Initial condition status | 1 = Updated<br>0 = Not updated |
| 7 | Parity | Even parity bit |
| 6 | 100G FEC mode echo | 0 = PCS data will use non-interleaved FEC<br>1 = PCS data will use interleaved FEC |
| 5:3 | Coefficient select echo | 5  4  3<br>1  1  0  = c(-2)<br>1  1  1  = c(-1)<br>0  0  0  = c(0)<br>0  0  1  = c(1) |
| 2:0 | Coefficient status | 2  1  0<br>1  1  1  = Reserved<br>1  1  0  = Coefficient at limit and equalization limit<br>1  0  1  = Reserved<br>1  0  0  = Equalization limit<br>0  1  1  = Coefficient not supported<br>0  1  0  = Coefficient at limit<br>0  0  1  = Updated<br>0  0  0  = Not updated |

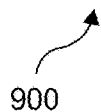

Status Field Structure

HYBRID PHY WITH INTERLEAVED AND NON-INTERLEAVED RS-FEC AND FEC MODE DETERMINATION DURING ADAPTIVE LINK TRAINING PROTOCOL

BACKGROUND INFORMATION

Ever since the introduction of the microprocessor, computer systems have been getting faster and faster. In approximate accordance with Moore's law (based on Intel® Corporation co-founder Gordon Moore's 1965 publication predicting the number of transistors on integrated circuits to double every two years), the speed increase has shot upward at a fairly even rate for nearly three decades. At the same time, the size of both memory and non-volatile storage has also steadily increased, such that many of today's personal computers are more powerful than supercomputers from just 10-15 years ago. In addition, the speed of network communications has likewise seen astronomical increases.

Increases in processor speeds, memory, storage, and network bandwidth technologies have resulted in the build-out and deployment of networks with ever substantial capacities. More recently, the introduction of cloud-based services, such as those provided by Amazon (e.g., Amazon Elastic Compute Cloud (EC2) and Simple Storage Service (S3)) and Microsoft (e.g., Azure and Office 365) has resulted in additional network build-out for public network infrastructure, in addition to the deployment of massive data centers to support these services which employ private network infrastructure.

A typical data center deployment includes a large number of server racks, each housing multiple rack-mounted servers or blade servers. Communications between the rack-mounted servers is typically facilitated using the Ethernet (IEEE 802.3) protocol over copper wire cables. In addition to the option of using wire cables, blade servers and network switches and routers may be configured to support communication between blades or cards in a rack over an electrical backplane or mid-plane interconnect.

In recent years, the speed of Ethernet connections over copper wiring has reached the 25 Gigabits per second (Gb/s) (over a single lane) and 100 Gb/s (over 4 lanes) using 25 GB/s signaling. Currently, the IEEE (Institute of Electrical and Electronics Engineers) is currently developing a specification (IEEE 802.3ck) defining Physical Layer Specifications and Management Parameters for 100 Gb/s, 200 Gb/s, and 400 Gb/s Electrical Interfaces Based on 100 Gb/s Signaling (latest draft IEEE P802.3ck/D1.0, 12 Dec. 2019).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 8 is a diagram of a control field for the training frame of FIG. 7 that has been augmented to support a 100G FEC mode request;

FIG. 9 is a diagram of a status field for the training frame of FIG. 7 that has been augmented to support a 100G FEC mode echo;

FIG. 19b is a rear isometric view of the blade server chassis of FIG. 19a;

DETAILED DESCRIPTION

Figures 1, 2:
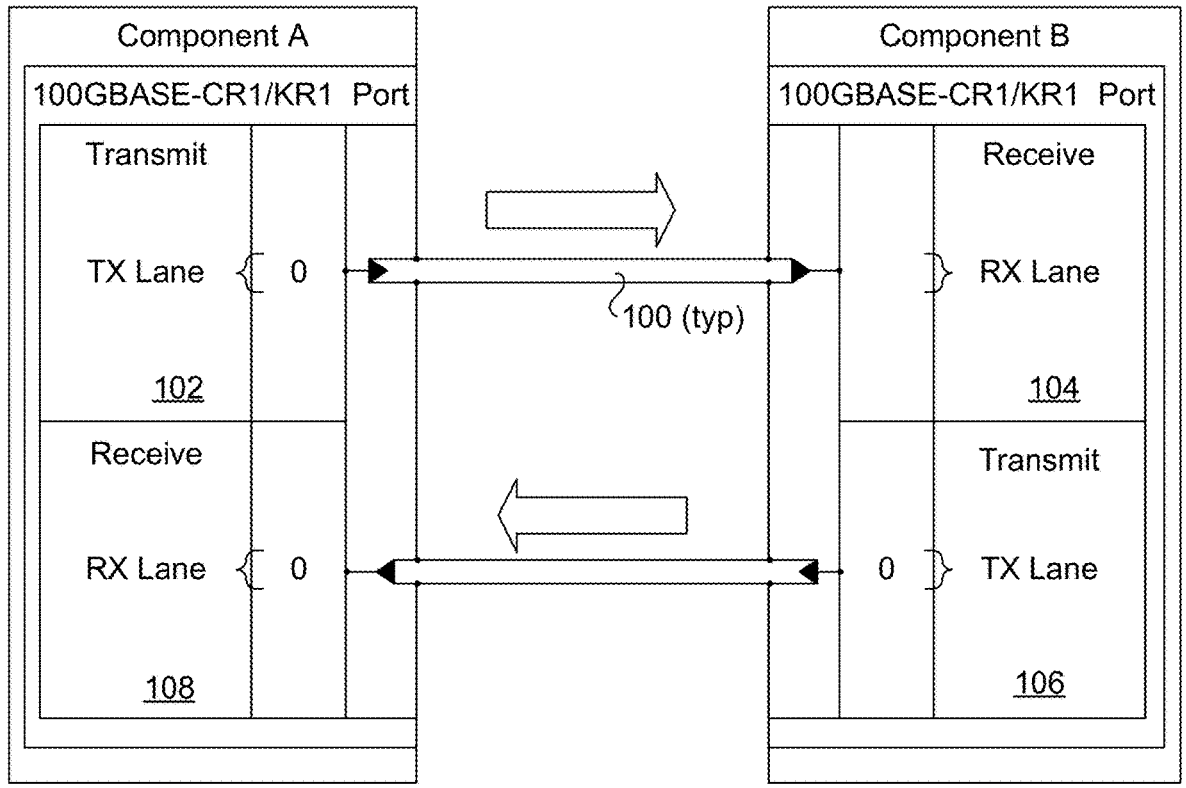
FIG. 1 is a schematic diagram illustrating the structure of a 100GBASE-CR1 link and 100GBASE-KR1 link, according to one embodiment.
FIG. 2 is a diagram illustrating mapping for PAM4 encoding.

Embodiments of apparatus with a hybrid Physical Layer (PHY) including interleaved and non-interleaved RS-FEC (Reed-Solomon Forward Error Correction) and configured to support FEC mode determination during adaptive link training protocol and associated methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiments described herein, apparatus and associated methods for implementing high-speed Ethernet links using a hybrid PHY (Physical layer) selectively configurable to implement a non-interleaved RS-FEC sublayer or an interleaved RS-FEC sublayer are provided. The embodiments further determine using an adaptive link training protocol whether to employ the non-interleaved or interleaved RS-FEC during link DATA mode. Training frames are exchanged between link partners including control and status fields used to respectfully request a non-interleaved or interleaved FEC mode (based on which FEC mode is determined) and confirm the requested FEC mode is to be used during link DATA mode.

One of the challenges of implementing high-speed Ethernet links using 100 Gb/s signaling is managing and correcting errors. One aspect of controlling errors employs Forward Error Correction (FEC), a technique used in data transmission over unreliable or noisy communication channels and links. There are two types of FEC being considered in the IEEE 802.3ck Task Force for a 100 Gbps single-lane PHY. FEC choice A "single FEC" has lower latency and a higher risk of decision feedback equalizer (DFE) error propagation. FEC choice B "interleave FEC" has higher latency and greatly reduces the risk of DFE error propagation or other types of burst errors that may be present in a receiver.

Draft standard IEEE P802.3ck/D1.0 in combination with other IEEE 802.3-based standards define, among other configurations, single-lane high-speed Ethernet links and interfaces referred to as 100GBASE-CR1 and 100GBASE-KR1. The Physical layer (also referred to a "PHY") structure of a 100GBASE-CR1 and 100GBASE-KR1 link is illustrated in FIG. 1. The PHY defines the physical structure of the interconnect and is responsible for dealing with details of operation of the signals on a particular link between two link partners, such as depicted by components A and B. This layer manages data transfer on the signal wires, including electrical levels, timing aspects, and logical issues involved in sending and receiving each bit of information across the parallel lanes. As shown in FIG. 1, the physical connectivity of each interconnect link is made up of a differential pair of signals 100, comprising a single lane (0) in each direction. As defined in IEEE 802.3 Clause 162, 100GBASE-CR1 uses 100GBASE-R encoding over one lane of shielded balanced copper cabling. As defined in IEEE 802.3 Clause 163, 100GBASE-KR1 uses 100GBASE-R encoding over one lane of an electrical backplane. Each port supports a link pair consisting of two uni-directional links to complete the connection between two components, also referred to as link partners. This supports traffic in both directions simultaneously.

Components with 100GBASE-CR1 and 100GBASE-KR1 ports communicate using a pair of uni-directional point-to-point links, defined as a link pair, as shown in FIG. 1. Each port comprises a Transmit (Tx) link interface and a Receive (Rx) link interface. For the illustrated example, Component A has a Tx port 102 that is connected to Component B Rx port 104. Meanwhile, Component B has a Tx port 104 that is connected to Component B Rx port 108. One uni-directional link transmits from Component A to Component B, and the other link transmits from Component B to Component A. The "transmit" link and "receive" link is defined relative to which component port is transmitting and which is receiving data. In the configuration illustrated in FIG. 1, the Component A transmit link transmits data from the Component A Tx port 102 to the Component B Rx port 104. This same Component A transmit link is the Port B receive link.

Each of the 100GBASE-CR1 and 100GBASE-KR1 PHY uses a 4-level pulse amplitude modulation (referred to as PAM4) signal to send and receive data across the channel. As shown in FIG. 2, PAM4 consists of four logical levels that are mapped as follows:

| 0 | maps to −1 |
| 1 | maps to −1/3 |
| 2 | maps to +1/3 |
| 3 | maps to +1 |

Logical levels 0 and 3 respectively correspond to low- and high-level signals having signal levels −1 and +1, while logical levels 1 and 2 correspond to intermediate-level signals having signal levels −1/3 and +1/3.

Figure 3:
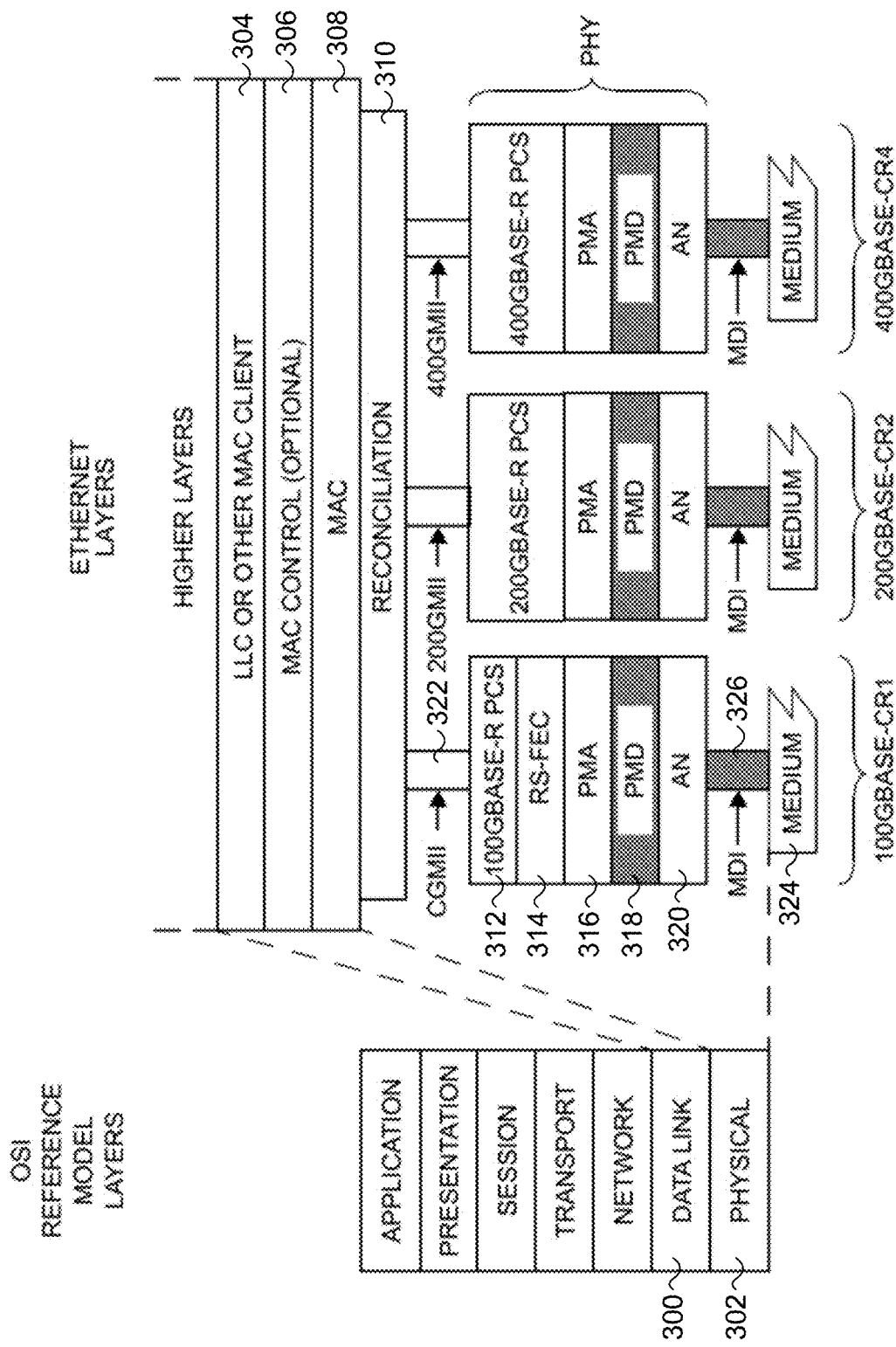
FIG. 3 is a block and layer diagram showing the 100GBASE-CR1, 200GBASE-CR2, and 400GBASE-CR4 relationship to the ISO/IEC Open Systems Interconnection (OSI) reference model and the IEEE 802.3 Ethernet model as currently proposed.

FIG. 3 shows the 100GBASE-CR1, 200GBASE-CR2, and 400GBASE-CR4 relationship to the ISO/IEC Open Systems Interconnection (OSI) reference model and the IEEE 802.3 Ethernet model as currently proposed. The following description is focused on the data link layer 300 and Physical layer (PHY) 302 for the 100GBASE-CR1. Data link layer 300 includes a logical link control (LLC) or other MAC (Media Access Control) client sublayer 304, an optional MAC control sublayer 306, and a MAC sublayer 308. PHY 302 includes a reconciliation sublayer 310, a 100GBASE-R PCS (Physical Coding Sublayer) 312, a Reed-Solomon Forward Error Correction (RS-FEC) sublayer 314, a Physical Medium Attachment (PMA) sublayer 316, a Physical Medium Dependent (PMD) sublayer 318, and an auto-negotiation (AN) sublayer 320. Reconciliation sublayer 310 is connected to 100GBASE-R PCS 312 via CGMMI 322, which is a 100 Gb/s Media Independent Interface. AN sublayer 320 is connected to the physical medium 324 (copper cable in the case of 100GBASE-CR1) via a Media Dependent Interface 324.

Figure 4:
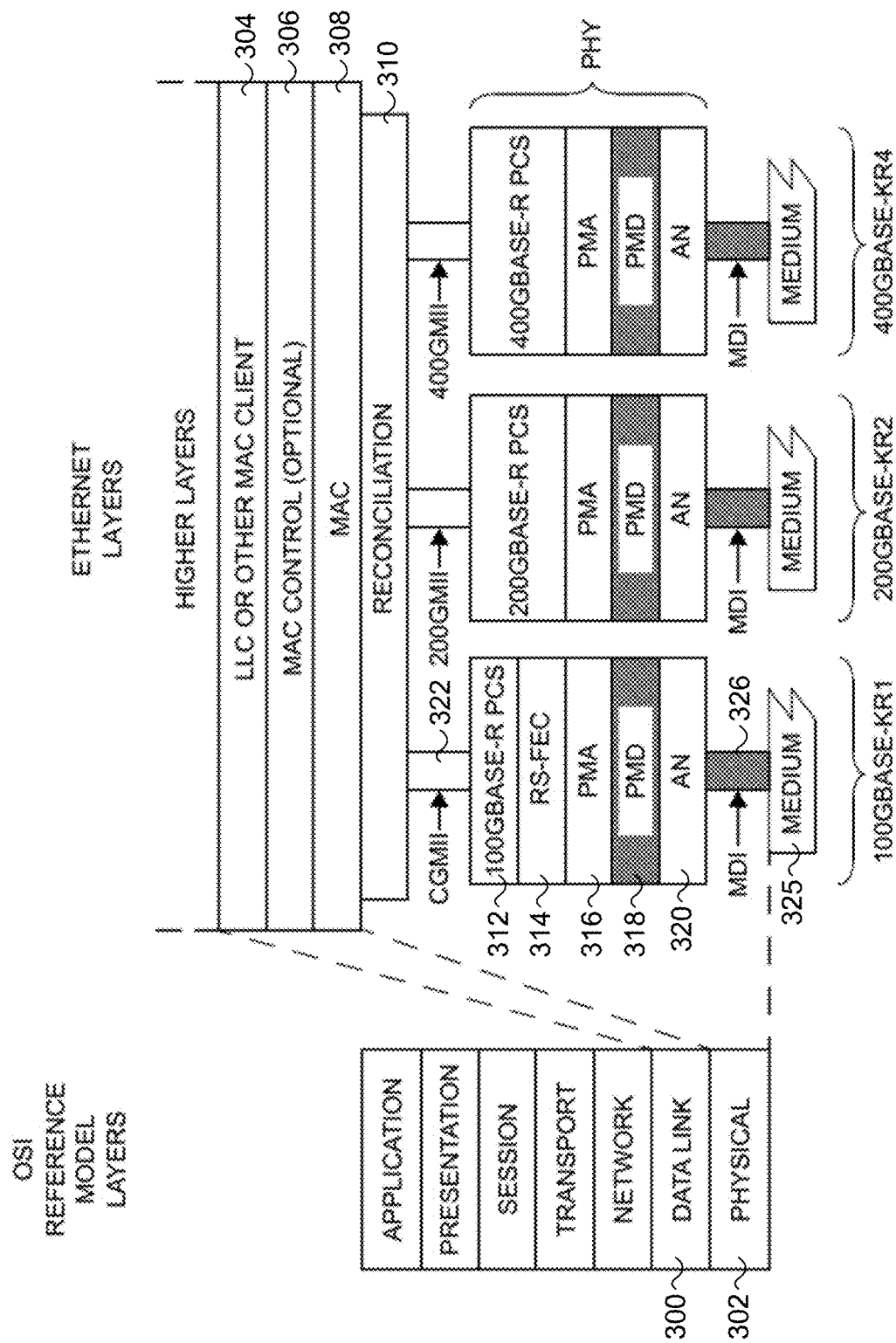
FIG. 4 is a block and layer diagram showing the 100GBASE-KR1, 200GBASE-KR2, and 400GBASE-KR4 relationship to the ISO/IEC Open Systems Interconnection (OSI) reference model and the IEEE 802.3 Ethernet model as currently proposed.

FIG. 4 shows the 100GBASE-KR1, 200GBASE-KR2, and 400GBASE-KR4 relationship to the ISO/IEC OSI reference model and the IEEE 802.3 Ethernet model as currently proposed. As shown by like-reference numbers in FIGS. 3 and 4 the sublayers for data link layer 300 and PHY 302 are the same for both 100GBASE-CR1 and 100GBASE-KR1, except physical medium 424 is backplane wiring rather than a copper cable.

Figure 5:
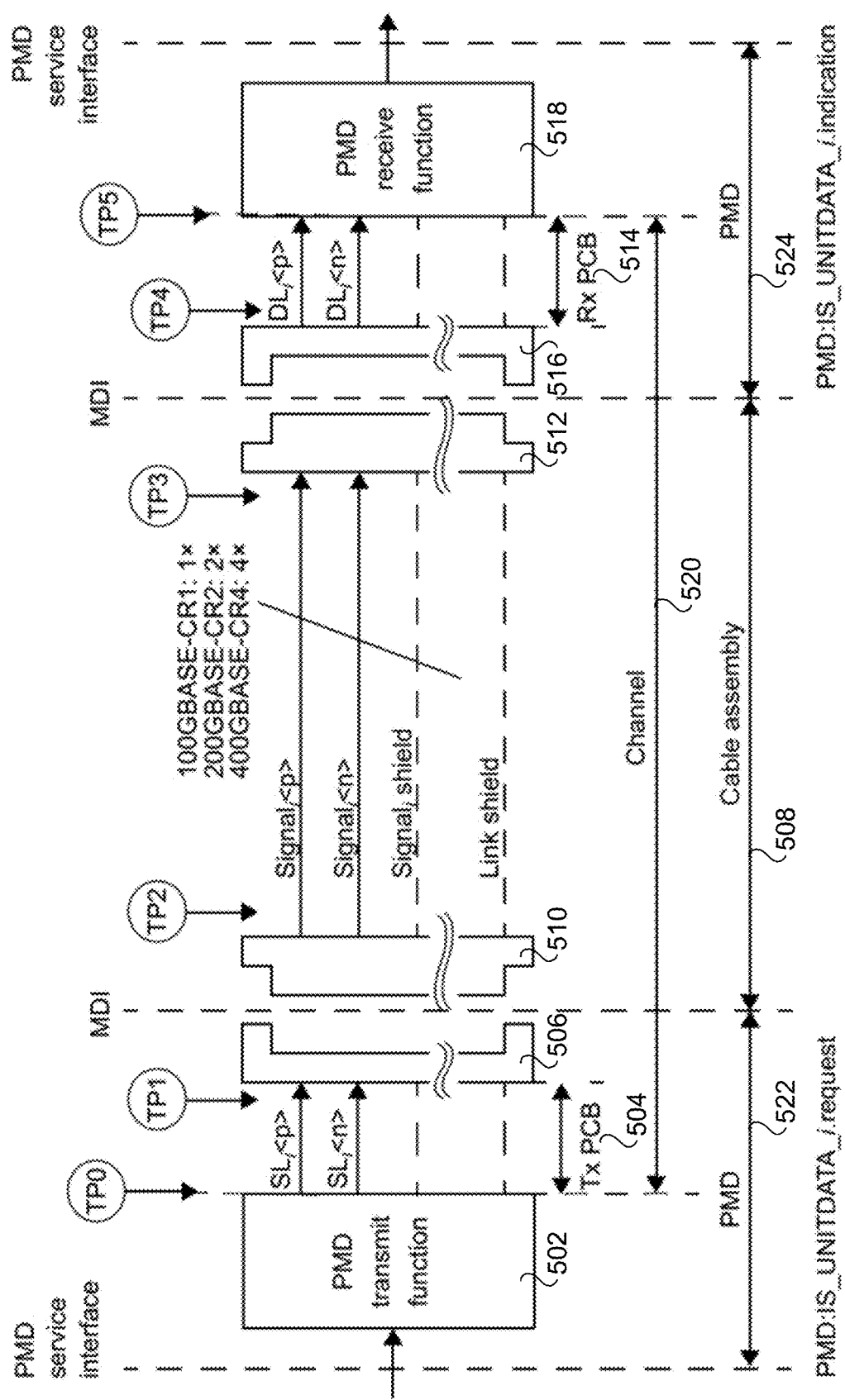
FIG. 5 is a link block diagram for one direction of a 100GBASE-CR1, 200GBASE-CR2, and 400GBASE-CR4 link.

FIG. 5 shows a link block diagram 500 for one direction of a 100GBASE-CR1, 200GBASE-CR2, and 400GBASE-CR4 link. At the block level, the link components include a PMD transmit function 502, a Tx printed circuit board (PCB) 504 attached to a connector 506, a cable assembly 508 including connectors 510 and 512, a Rx PCB 514 attached to a connector 516 and a PMD receive function 518. At a first logical level, the blocks include PMD transmit function 502 coupled to PMD receive function 518 via a channel 520. At a second logical level, the blocks including a PMD 522, cable assembly 508, and a PMD 524. The source lane (SL) signals SLi<p> and SLi<n> are the positive and negative sides of the transmitter's differential signal pair on lane i and the destination lane (DL) signals DLi<p> and DLi<n> are the positive and negative sides of the receiver's differential signal pair on lane i.

Figure 6:
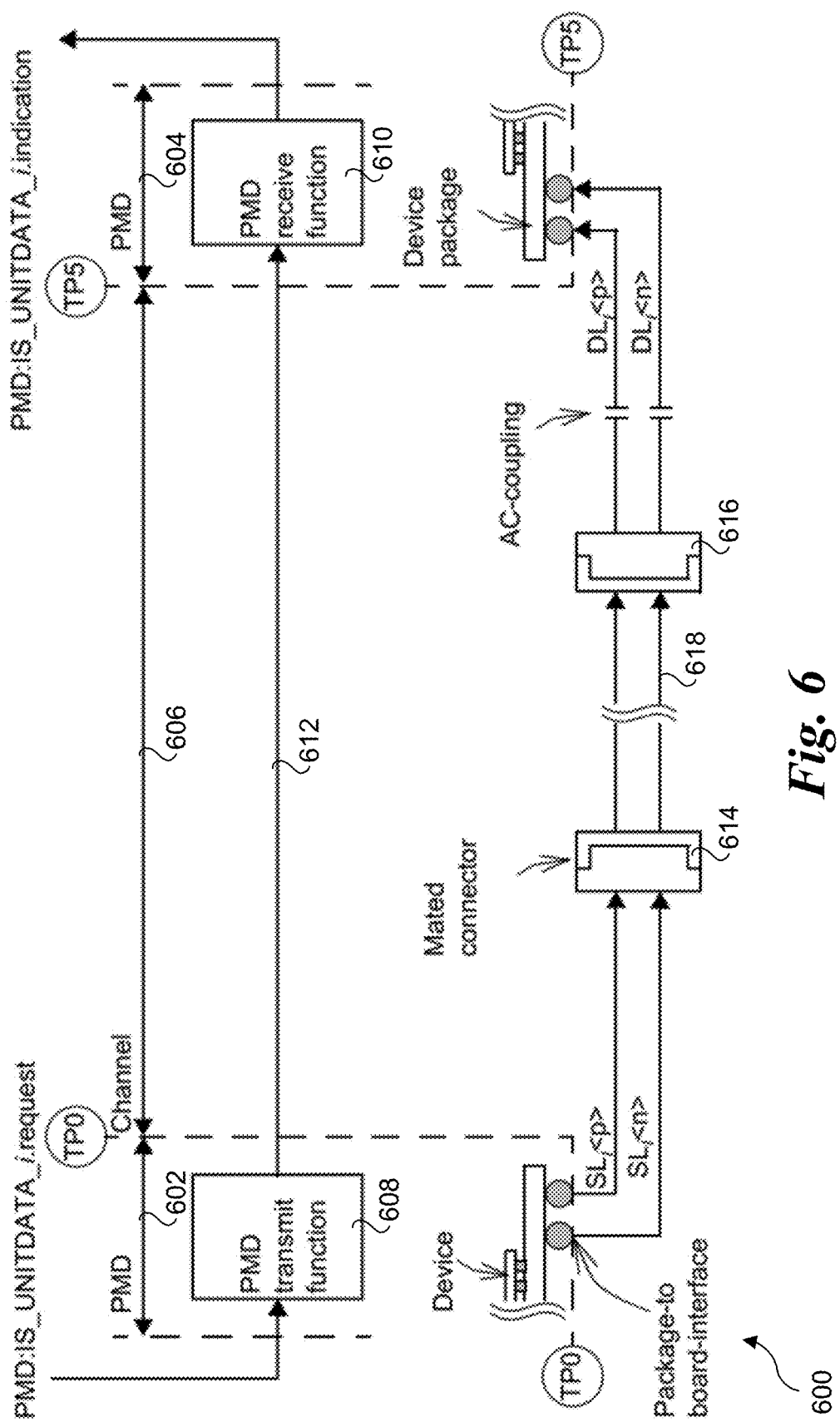
FIG. 6 is a link block diagram for one direction of a 100GBASE-KR1 link.

FIG. 6 shows a link block diagram 600 for one direction of a 100GBASE-KR1 link. At the top level, the blocks include a transmit PMD 602 coupled to a receive PMD 604 via a channel 606. At the next level, the blocks include a PMD transmit function 608 coupled to PMD receive function 610 via a link 612. As shown toward the bottom of diagram 600, the physical components include a device coupled to a board via a device package and package-to-board interface. In some embodiments, a portion of a 100GBASE-KR1 link may include a cable, flat ribbon, or a similar flexible signal transmission medium. Accordingly, FIG. 6 also depicts mated connectors 614 and 616 coupled to a flexible signal transmission medium 618. In some instances, a 100GBASE-KR1 link may include AC-coupling to couple signals having different voltage levels.

One of the challenges of implementing high-speed links using 100 Gb/s signaling is managing and correcting errors. One aspect of controlling errors employs Forward Error Correct (FEC), a technique used in data transmission over unreliable or noisy communication channels and links. There are two types of FEC being considered in the IEEE 802.3ck Task Force for a 100 Gbps single-lane PHY. One type of FEC being considered is the FEC defined by IEEE 802.3 Clause 91, referred to herein as the "Clause 91 FEC" and associated Clause 91 FEC mode. Use of the Clause 91 FEC mode has lower latency, but also has a higher risk of decision feedback equalizer (DFE) error propagation. The second FEC being considered is referred to as the "interleaved FEC" and associated interleaved FEC mode, which greatly reduces the risk of DFE error propagation or other sources of burst errors at the expense of higher latency.

In accordance with aspects of the embodiments herein, a hybrid approach is used, wherein depending on link conditions evaluated during training the Clause 91 FEC mode or interleaved FEC mode is requested to be used when the link transitions to DATA mode. Since the FEC mode can be requested during the link training stage of link bring up (when the local receiver is adapting to the channel's characteristics), the local receiver will have knowledge of impairments and the expected risk of DFE error propagation. This will allow the receiver to make the appropriate and best FEC mode request to its transmitter partner after analysis of the channel characteristics.

In one aspect, a means is provided during link training to enable link partners to request and confirm which FEC mode to be used once the link transitions to DATA mode through use of information contained in control field and status field cells in the training frame. Embodiments of the training frame 700, control field 800, and status field 900 are respectively shown in FIGS. 7, 8, and 9.

Figure 7:
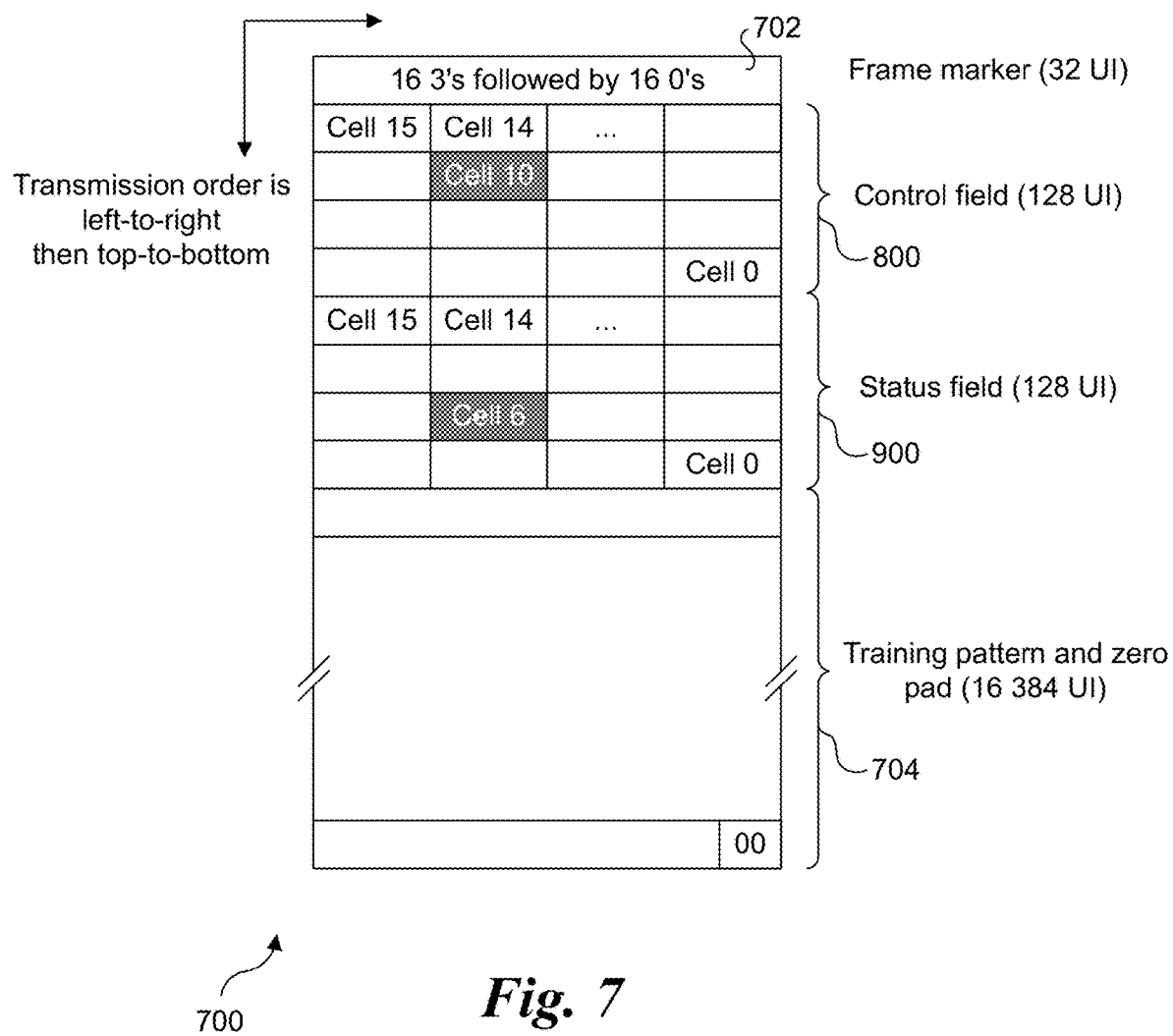
FIG. 7 is a diagram of a training frame, according to one embodiment

The physical signaling for the 100GBASE-CR1 and KR1 PHY employs a Unit Interval (UI) of 1 bit having a time corresponding to 53.125 Gbd symbols (~18.8 psec). As shown in FIG. 7, training frame 700 has a fixed-length structure 700 including a 32 UI frame marker 702, a 128 UI control field 800, a 128 UI status field 900, and a training pattern 704 with zero pad of 16,384 UI. The training frame is a sequence of PAM4 symbols whose values correspond to the possible values of the tx_symbol and rx_symbol variables (the PAM4 symbol values 0, 1, 2, and 3 correspond to tx_symbol or rx_symbol values zero, one, two, and three, respectively, as shown in FIG. 2). During training, training frame 700 is sent continuously from each transmitter in the link pair.

Frame marker 702 is used to delimit training frames 700 using a specific sequence of PAM4 symbols comprising a run of 16 consecutive '3' symbols followed by a run of 16 consecutive '0' symbols. This sequence will never exist in the control field, status field, or training pattern and it uniquely identifies the beginning of a training frame.

Each of control field 800 and status field 900 comprises 16 bits, wherein each bit of the control and status fields is sent as a differential Manchester encoded (DME) cell having a length of eight UI. The specific rules for this encoding are:
 a) A transition from 0 to 3 or from 3 to 0 occurs at the start of each cell.
 b) A transition from 0 to 3 or from 3 to 0 at the midpoint of a cell, i.e., four UIs from the transition at the beginning of the cell, corresponds to a logical one.
 c) The absence of a transition at the midpoint of a cell corresponds to a logical zero.

Control field 800 is transmitted immediately after frame marker 702. Status field 900 is transmitted immediately after control field 800. Within each field, the order of transmission is from bit 15 to bit 0. When a training frame is received, if a violation of the DME encoding rules is detected within the control field or the status field, the contents of both fields in that frame are ignored.

Figure 10:
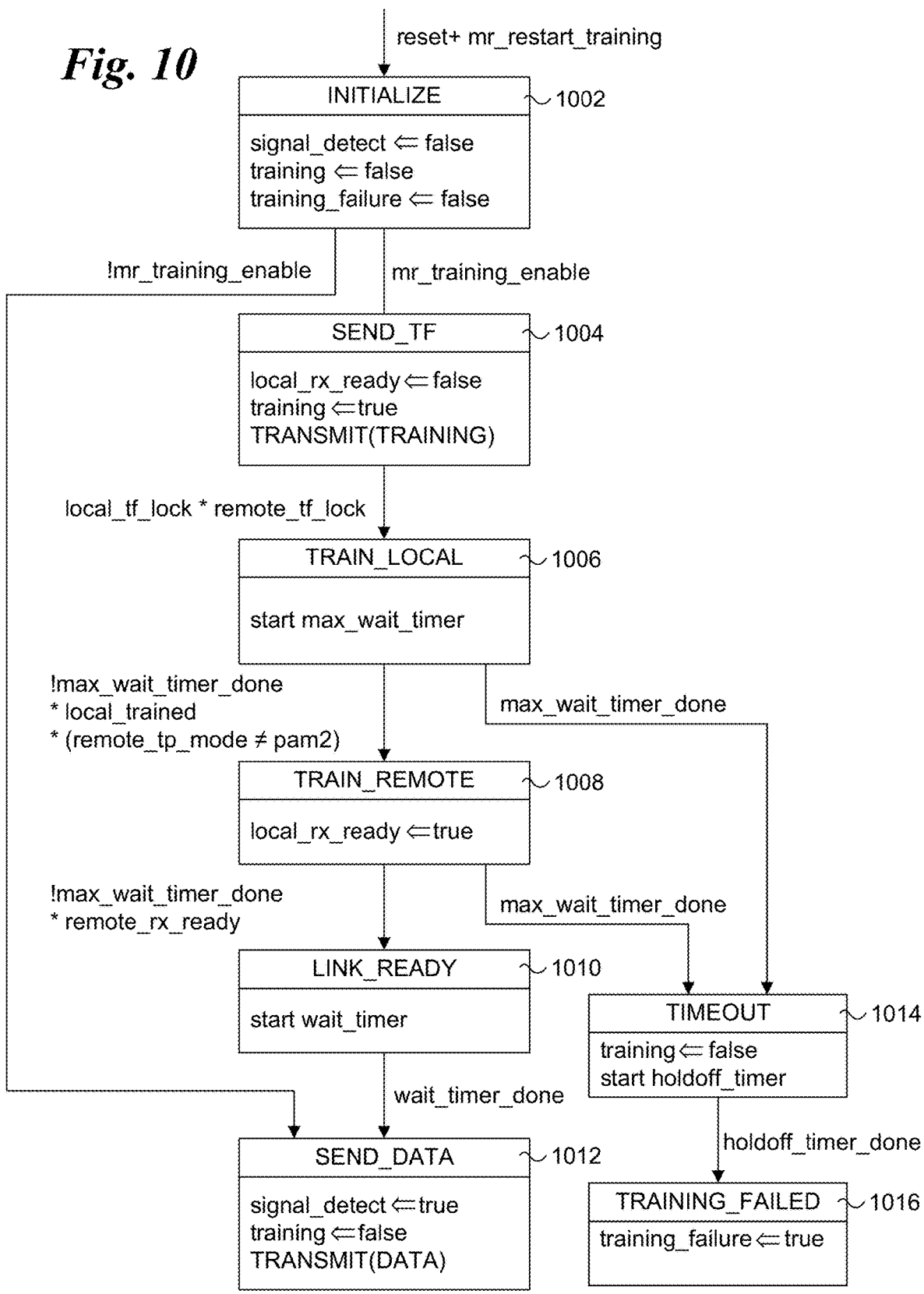
FIG. 10 is a PMD control state diagram for implementing the state machine for the PMD control function, according to one embodiment.

The 100GBASE-CR1 and 100GBASE-KR1 link is established using the following sequence:
 (1) Auto-negotiate capabilities to link partner
 (2) Send out training sequence to tune PHY for the channel's characteristics
  Obtain Frame Lock
  TX FFE handshake: Adapt Tx coefficients to channel characteristics
  DSP converged: Train Rx to channel
  Status Exchange: Ready or not?
 (3) Countdown to DATA mode and Send out idle symbols Under aspects of the embodiments herein, the PMD control function (also referred to as the link training protocol) control field, and status field are modified to enable the FEC mode to be requested during link training. The PMD control state diagram 1000 for implementing the state machine for the PMD control function is shown in FIG. 10. The PMD control function states include an initialize state 1002, and SEND_TF state 1004, a TRAIN_LOCAL state 1006, a TRAIN_REMOTE state 1008, a LINK_READY state 1010, a SEND_DATA state 1012, a TIMEOUT state 1014, and a TRAINING_FAILED state 1016. Implementation of link training for the 100GBASE-CR1 and 100GBASE-CR1 PHYs, including use of PMD control state diagram 1000, are described in IEEE Std 802.cd-2018, Clause 136.

The mechanisms for enabling request and confirmation of the FEC mode are provided by augmented versions of the control field and status field, as shown by control field 800 and status field 900. In further detail, bit/cell 10 of control field structure 800 has been repurposed to define the requested 100G FEC mode, wherein a '0' indicates the link partner requests to use the non-interleaved 100G FEC mode, while a '1' indicates the link partner requests to use the 100G FEC interleaved mode.

As discussed above, during link training the link partners exchange training frames 700, wherein the control field is used by a given partner to effect a control operations (in this case requesting the 100G FEC mode) and the status field is used by the other partner to confirm the training status. As shown in status field structure 900 in FIG. 9, bit/cell 6 has been repurposed define the 100G FEC mode echo, which enables the link partner to provide feedback on the type of 100G FEC encoding that is to be used when the partner starts to transmit PCS data in state SEND_DATA 1012. Similar to before, a '0' for bit/cell 6 indicates the link partner confirms the non-interleaved 100G FEC mode will be used for the DATA mode, while a '1' indicates the link partner confirms the 100G FEC interleaved mode will be used for the DATA mode.

For the purpose of this example, it is assumed that the non-interleaved FEC would be the default; in other words, a receiver would need to explicitly request to use the interleave FEC. However, this could be swapped or configured via non-volatile memory settings. Under an alternative embodiment the bits '0' and '1' for the 100G FEC mode and 100G FEC mode echo fields could be reversed.

Figure 11:
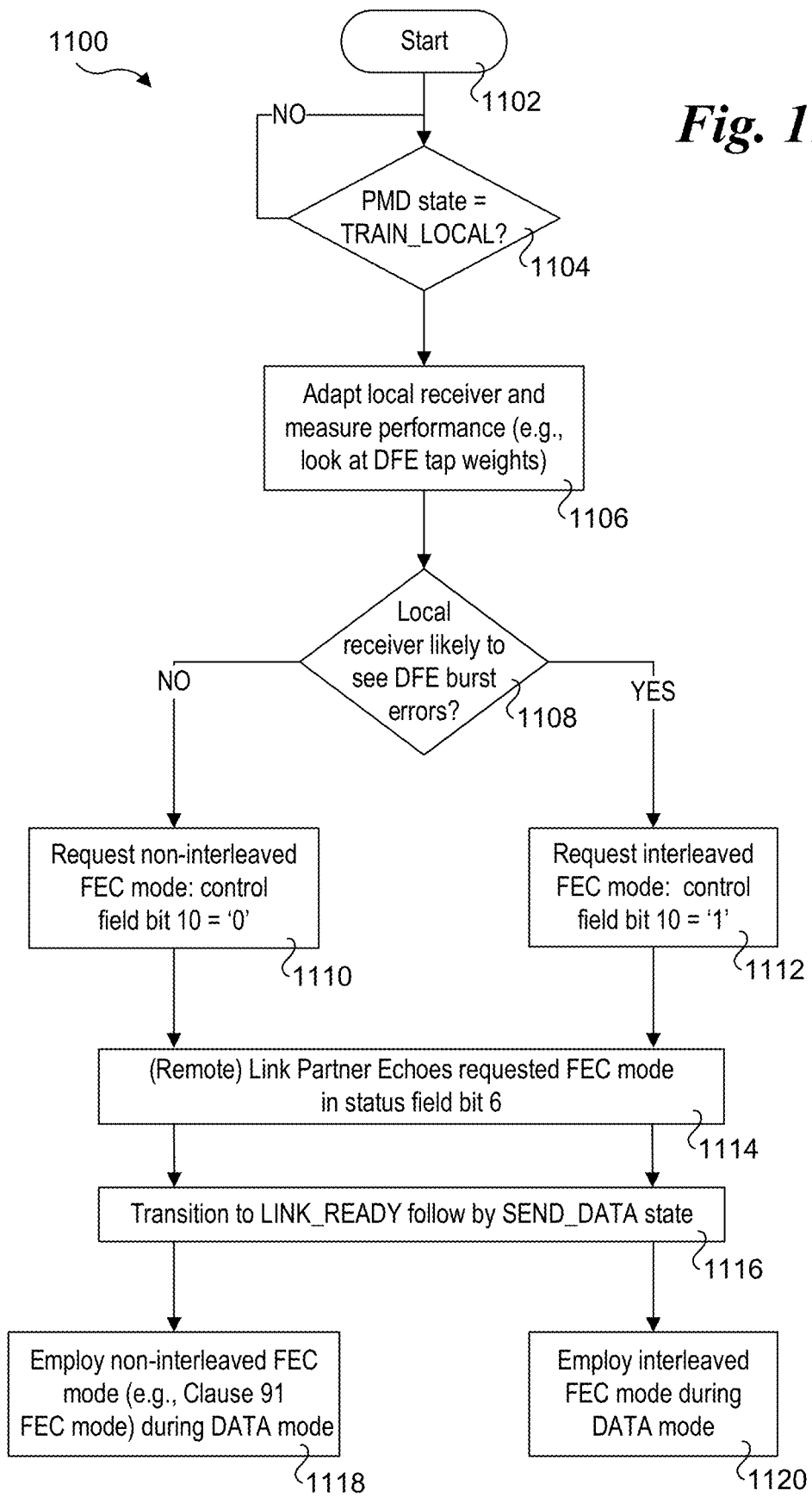
FIG. 11 is a flowchart illustrating operations and logic for determining a FEC mode and configuring the transmitter and receiver of link partners to employ a non-interleaved FEC or interleaved FEC in accordance with the FEC mode that is determined, according to one embodiment.

The two states in PMD control state diagram 1000 during which 100G FEC mode request and confirmation are TRAIN_LOCAL state 1006 and TRAIN_REMOTE state 1008. With reference to a flowchart 1100 of FIG. 11, while in TRAIN_LOCAL state 1006 a local receiver performs the following operations to determine which 100G FEC mode to use.

Following a start block 1102, detection of entry into the TRAIN_LOCAL PMD state 1006 is made, as depicted by a decision block 1104. Once the TRAIN_LOCAL PMD state 1006 is entered, the answer to decision block 1104 is YES, and the logic proceeds to a block 1006 in which the local receiver is adapted using the receiver's DFE and DFE performance is measured, such has the DFE tap weights/coefficients.

In a decision block 1108 a determination is made to whether the local receiver is likely to see DFE burst errors based on the DEF performance measured in block 1106. If the answer is NO, the logic proceeds to the lower-left portion of flowchart 1100, beginning with a block 1110 in which the local link partner implementing the local receiver requests to use the non-interlaced FEC mode by setting control bit 10 to '0'. If the local receiver is determined to be likely to see DFE burst errors in decision block 1108, the logic proceeds to the lower-right portion of flowchart 1100, beginning with a block 1111 in which the component implementing the local receiver requests to use the interlaced FEC mode by setting control bit 10 to '1'. As discussed above, the bit values for the non-interlaced FEC mode and interlaced FEC mode may be swapped.

To effect the FEC mode request, the local link partner transmits the request in the training frame sent to its (remote) link partner. As shown in a block 1114, the remote link partner echoes the requested FEC mode by setting (to '1') or clearing (to '0') status field bit 6, as applicable. The echo operates both as an acknowledgement of the request and a confirmation that the transmitter of the remote link partner will employ the requested FEC mode during the link's DATA mode (i.e., for data transmitted from the transmitter of the link partner to the receiver. In a block 116 the PMD control state advances first advances to LINK_READY state 1010, and subsequently transitions to SEND_DATA state 1012. As shown in a block 1118, when the non-interlaced FEC mode has been requested and echoed, the non-interlaced FEC mode is employed during the link's DATA mode. Conversely, as shown in a block 1120, when the interlaced FEC mode has been requested and echoed, the interlaced FEC mode is employed during the link's DATA mode.

Figure 12:
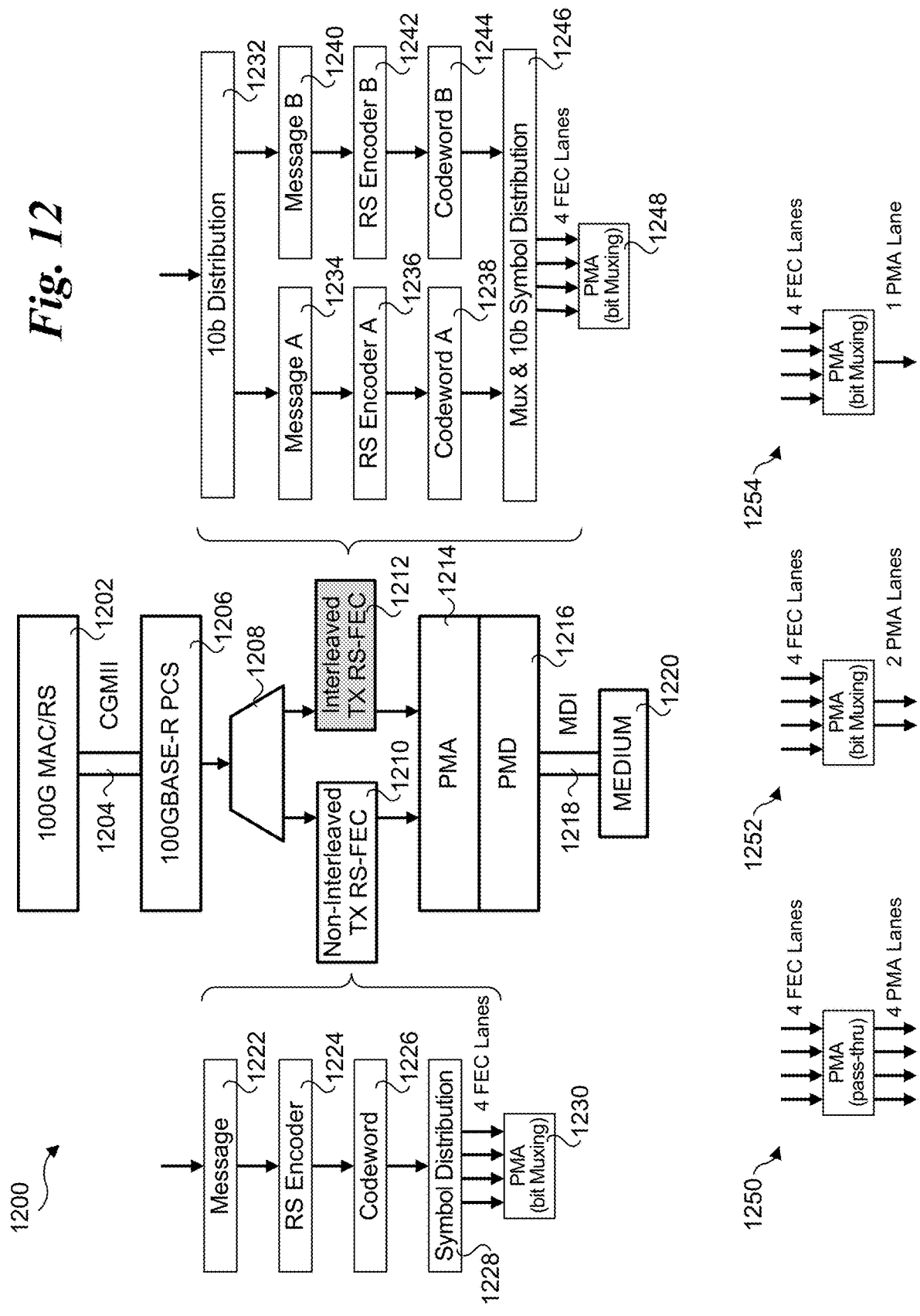
FIG. 12 is a schematic diagram of a hybrid transmitter (TX) PHY, according to one embodiment.

FIG. 12 shows a hybrid TX PHY 1200 configured to be implemented for a transmitter supporting both a non-interlaced FEC mode and an interlaced FEC mode, according to one embodiment. A 100GBASE-R PCS 1206 of hybrid TX PHY 1200 is connected to a 100G MAC/RS layer 1202 via a CGMII 1204. A multiplexer (MUX) 1208 is used to select whether to use a non-interleaved TX RS-FEC 1210 or an interleaved TX RS-FEC 1212. The output from the non-interleaved FEC 1210 or interleaved FEC 1212 is passed to a PMA sublayer 1214, and then to a PMD sublayer 1216, which is connected to the link medium 1220 via an MDI 1218.

Figure 14:
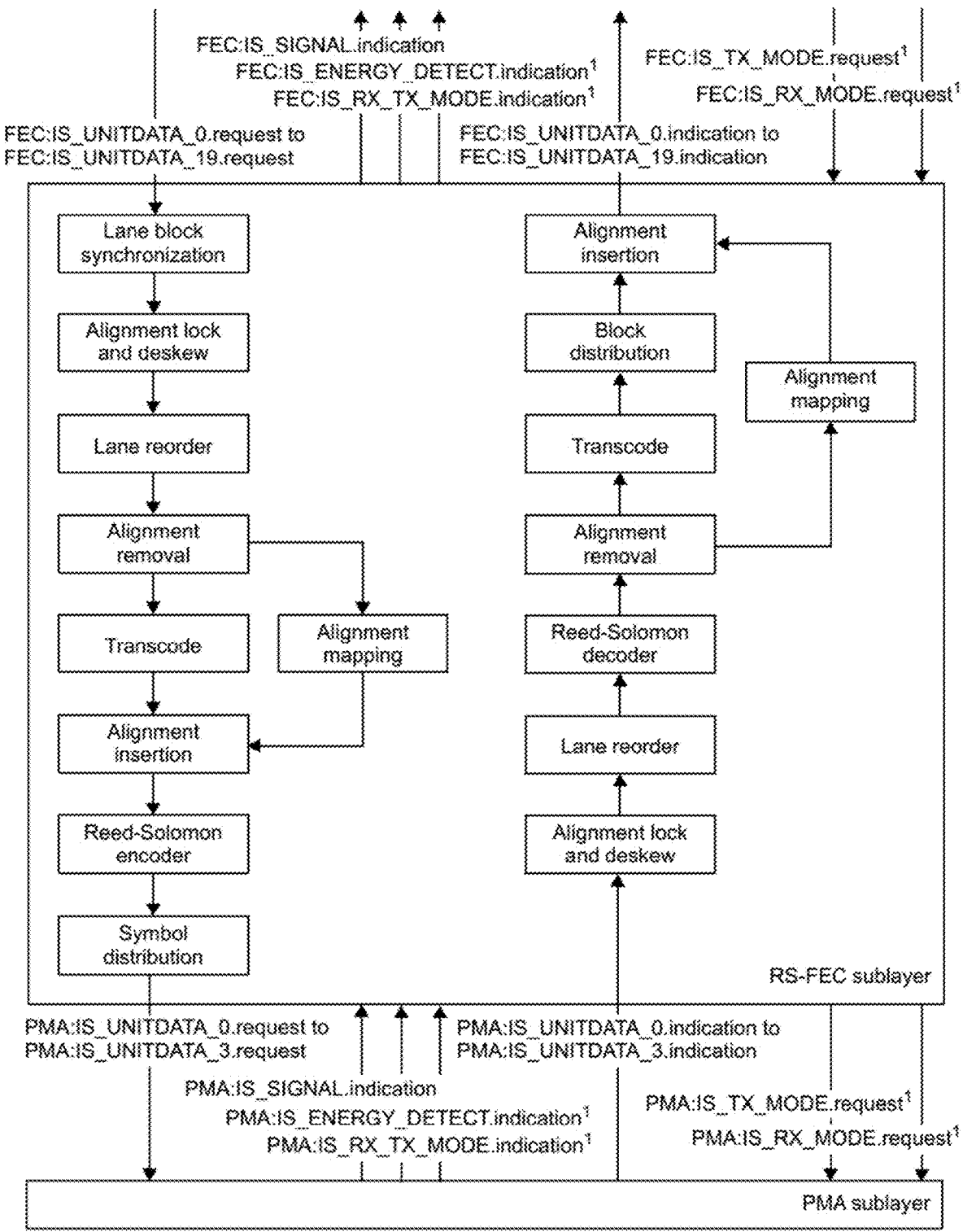
FIG. 14 is a functional block diagram of an RS-FEC sublayer as defined in IEEE std. 802.3-2018, Clause 91.
Figure 15:
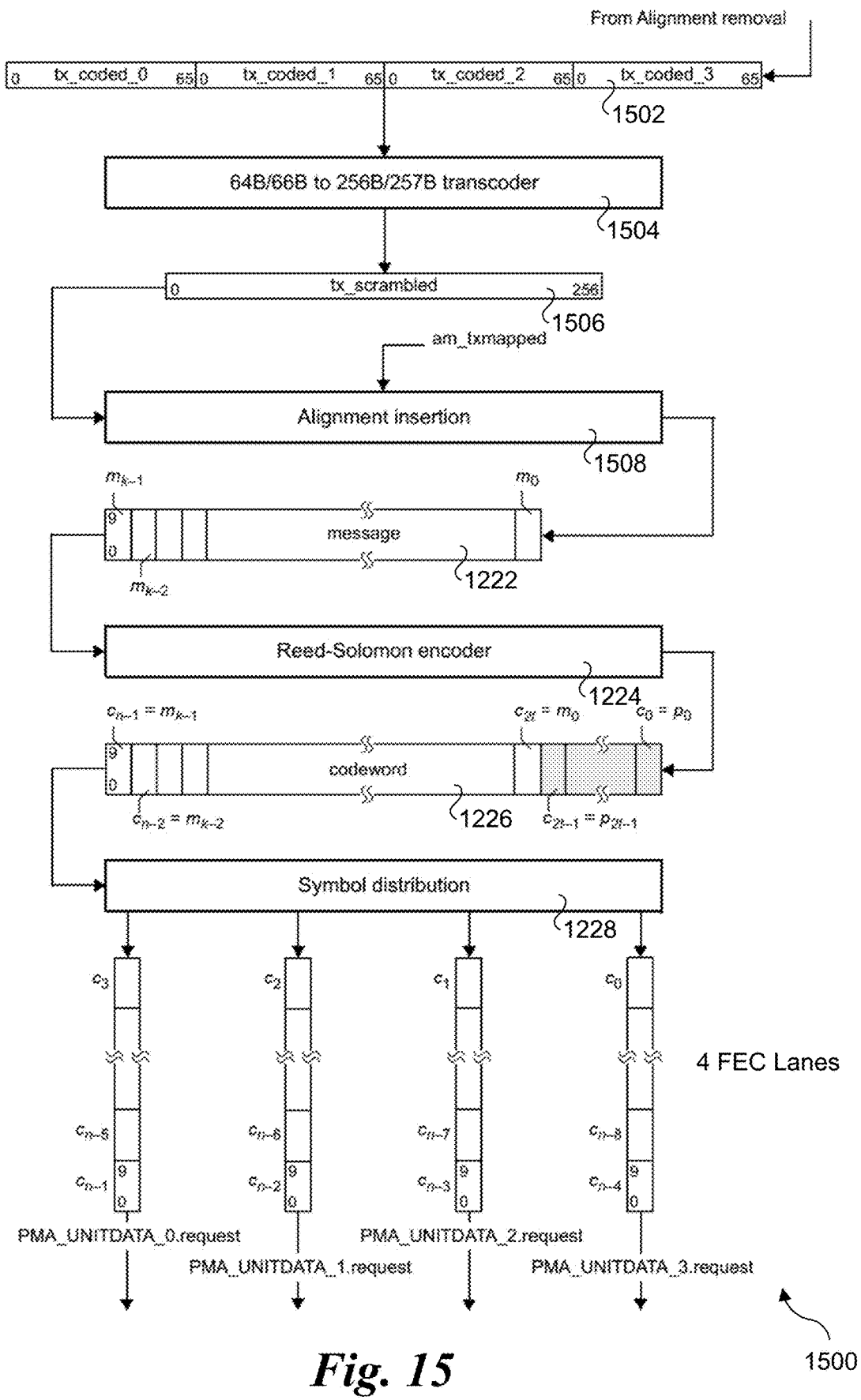
FIG. 15 is a diagram illustrating transmit bit ordering implemented by the transmitter as defined in IEEE std. 802.3-2018, Clause 91.

An abstracted representation of one embodiment of non-interleaved TX RS-FEC 1210 is shown toward the left side of hybrid TX PHY 1200. In this embodiment non-interleaved TX RS FEC 1210 is implemented in accordance with the TX RS-FEC defined in IEEE 802.3-2018 Clause 91. Under this RS-FEC, a message 1222 is generated after pre-processing data received from 100GBASE-R PCS 1206 and is encoded with an RS encoder 1224, which outputs a codeword 1226 that is fed into a system distribution block 1228, which in turn outputs 4 FEC lanes into a PMA bit Muxing block 1230. Further details of TX RS-FEC 1210 are shown in FIGS. 14 and 15 and described below.

Figure 17:
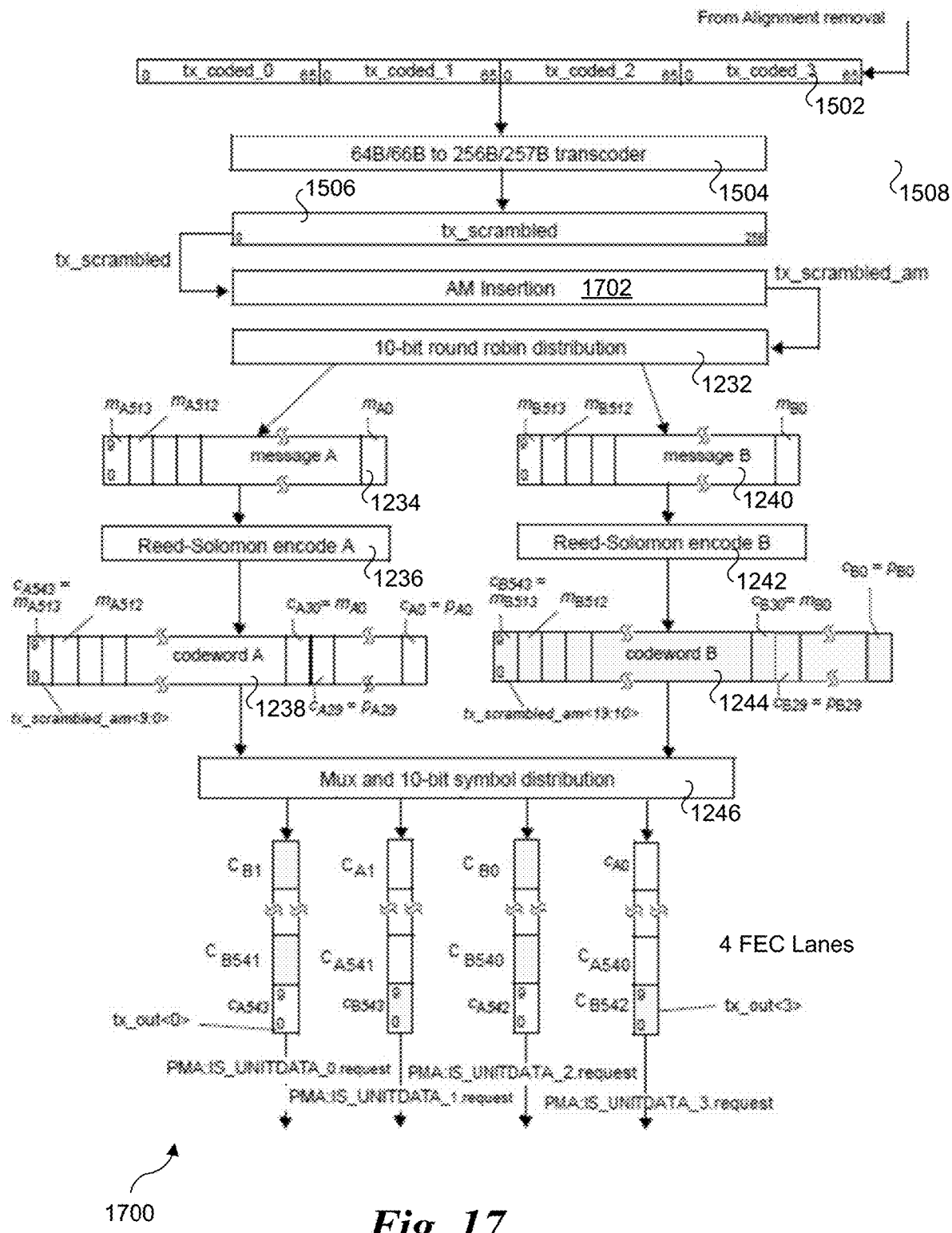
FIG. 17 is a data flow diagram illustrating further details of the hybrid TX PHY of FIG. 12.

An abstracted representation of an embodiment of interleaved TX RS-FEC 1212 is shown toward the right side of hybrid TX PHY 1200. In this embodiment the TX RS-FEC 1212 corresponds to the TX RS-FEC proposed by Shawn Nicholl and Ben Jones at the IEEE P802.3ck Interim Meeting in Salt Lake City, Utah (May 2019), a copy of which is available at http://www.ieee802.org/3/ck/public/19_05/nicholl_3ck_01b_0519.pdf (hereinafter Nicholl et al. presentation). A 10b round robin distribution block 1232 receives pre-processed data (as described below) employs a 10-bit round robin distribution function to output a pair of messages A (1234) and B (1240). Message A 1234 is encoded with an RS encoder 1236, which outputs a code word 1238 that is provided as an input to a Mux & 10b symbol distribution block 1246. Meanwhile, in parallel to the processing of message A, message B 1240 is encoded using an RS encoder 1242, which outputs a codeword 1244 that is provided as an input to Mux & 10b symbol distribution block 1246. Further details of TX RS-FEC 1212 are shown in FIG. 17 and described below.

As shown toward the bottom of FIG. 12, PMA bit Muxing blocks 1230 and 1248 may implement one of three configurations. Under a PMA pass-thru block 1250, the block receives input from 4 FEC lanes and outputs 4 PMA lanes. Under a PMA bit Muxing block 1252, the block receives input from 4 FEC lanes and outputs 2 PMA lanes. Under a PMA bit Muxing block 1254, the block receives input from 4 FEC lanes and outputs a single PMA lane.

Figure 13:
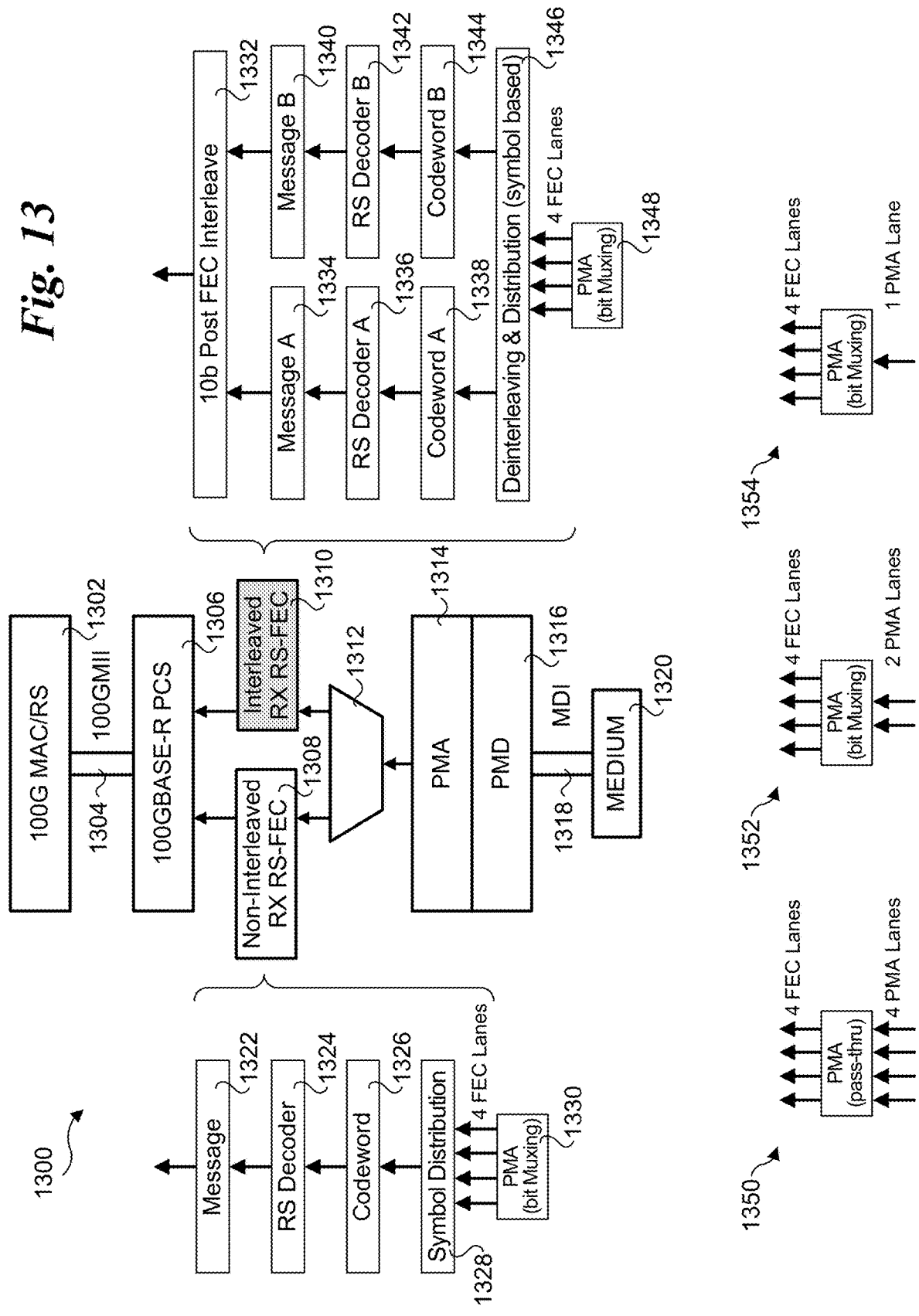
FIG. 13 is a schematic diagram of a hybrid receiver (RX) PHY, according to one embodiment.

FIG. 13 shows a hybrid RX PHY 1300 configured to implement a receiver supporting both a non-interlaced FEC mode and an interlaced FEC mode, according to one embodiment. A 100GBASE-R PCS 1306 of hybrid RX PHY 1300 is connected to a 100G MAC/RS layer 1302 via a CGMII 1304. A multiplexer (MUX) 1312 is used to select whether to use a non-interleaved RX RS-FEC 1308 or an interleaved RX RS-FEC 1310. The input from the non-interleaved FEC 1308 or interleaved FEC 1310 is received from a PMA sublayer 1314, which is coupled to a PMD sublayer 1316, which is connected to the link medium 1320 via an MDI 1318.

An abstracted representation of one embodiment of non-interleaved RX RS-FEC 1308 is shown toward the left side of hybrid RX PHY 1300. In this embodiment non-interleaved RX RS-FEC 1308 is implemented in accordance with the RX RS-FEC defined in IEEE 802.3-2018 Clause 91. Under this RS-FEC, the block level components include a message 1222, and RS decoder 1324, a codeword 1326, a symbol distribution block 1328 and a PMA bit Muxing block 1330. An input from PMA sublayer 1314 is received by PMA bit Muxing block 1330, which outputs 4 FEC lanes that are received by symbol distribution block 1328, which outputs data that is used to form codeword 1326. Codeword 1326 is then decoded with RS decoder 1324 to extract a message 1324. After some further processing of message 1322 (as described below with reference to FIGS. 14 and 16), message data output from RX RS-FEC 1308 is received by 100GBASE-R PCS 1306.

Figure 18:
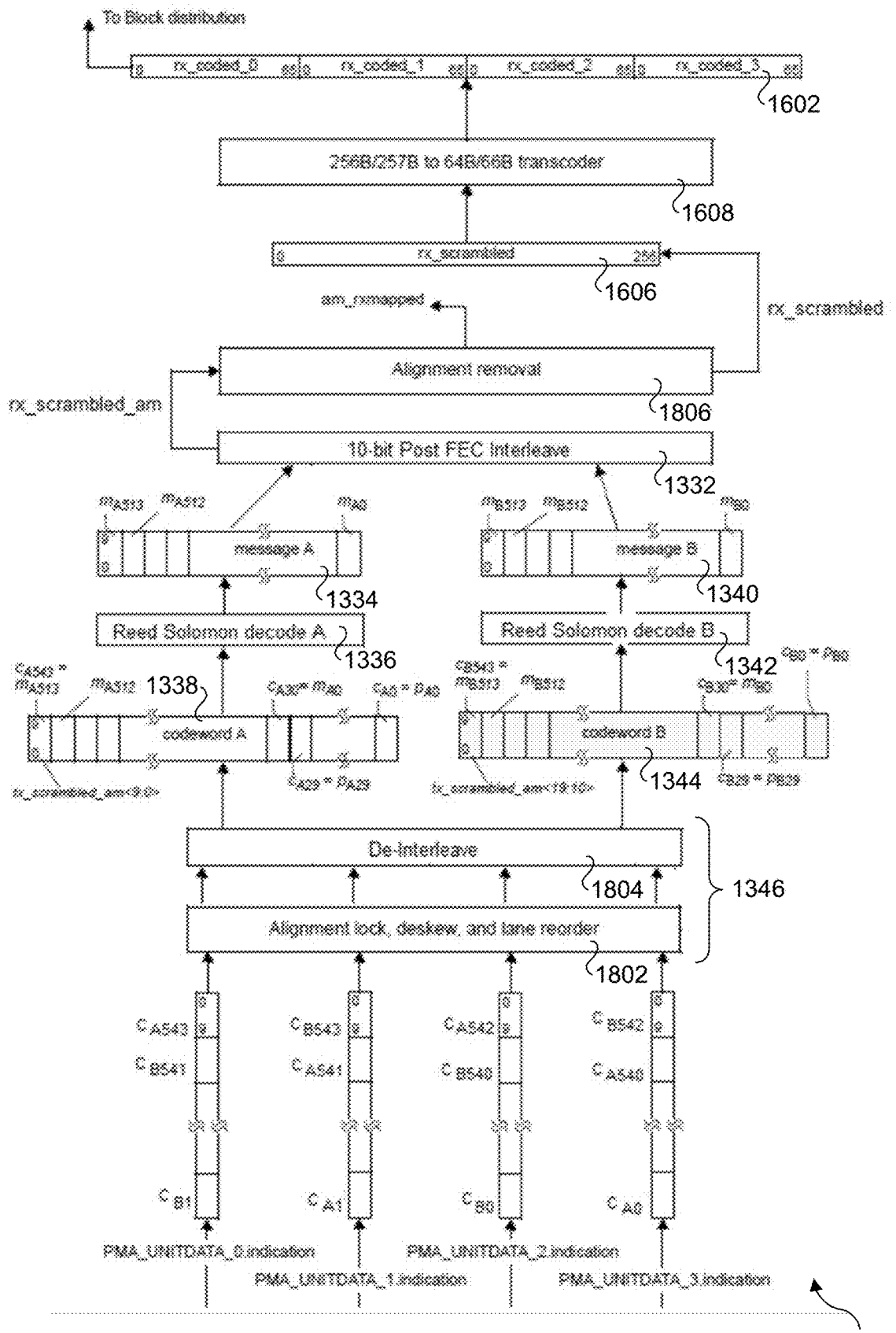
FIG. 18 is a data flow diagram illustrating further details of the hybrid RX PHY of FIG. 13.

An abstracted representation of an embodiment of interleaved RX RS-FEC 1310 is shown toward the right side of hybrid RX PHY 1300. In this embodiment the RX RS-FEC 1310 corresponds to the RX RS-FEC proposed in the Nicholl et al. presentation. The illustrated blocks include a 10b post FEC interleave block 1332, message A 1334, an RS decoder 1336, a codeword 1338, message B 1340, an RS decoder 1342, a codeword 1344, a deinterleaving and distribution block 1346, and a PMA bit Muxing block 1348. An input from PMA sublayer 1314 is received by PMA bit Muxing block 1348, which outputs 4 FEC lanes that are received by deinterleaving and distribution block 1346, which outputs data that is used to form codeword 1338 and codeword 1344. Codeword 1338 is then decoded with RS decoder 1336 to extract message 1334, which is provided as an input to 10 b post FEC interleave block 1332. In parallel, Codeword 1344 is decoded with RS decoder 1342 to extract message 1340, which is provided as an input to 10 b post FEC interleave block 1332. Further details of RX RS-FEC 1310 are shown in FIG. 18 and described below.

As shown toward the bottom of FIG. 13, PMA bit Muxing blocks 1330 and 1348 may implement one of three configurations. Under a PMA pass-thru block 1350, the block receives input from 4 MPA lanes and outputs 4 FEC lanes. Under a PMA bit Muxing block 1352, the block receives input from 2 PMA lanes and outputs 4 FEC lanes. Under a PMA bit Muxing block 1354, the block receives input from a single PMA lane and outputs 4 FEC lanes.

FIG. 14 is a reproduction of FIG. 91-2 from IEEE std. 802.3-2018 Clause 91, which illustrates a functional block diagram of an RS-FEC sublayer. The left side of FIG. 14 depicts block-level operations performed by the RS-FEC sublayer in the transmitter, while the right side of FIG. 14 depicts block-level operations performed by the RS-FEC sublayer in the receiver.

FIG. 15 is a reproduction of FIG. 91-6 from IEEE std. 802.3-2018 Clause 91, which illustrates transmit bit ordering implemented by the transmitter. The process begins from the alignment removal block of FIG. 14, which includes TX 64B/66B coded data 1502 comprising four 66-bit blocks having 64B/64B encoding. The four 66-bit blocks are transcoded from 64B/64B encoding to 256B/257B encoding using a 64B/66B to 256B/257B transcoder 1502. The transcoder constructs a 257-bit block, tx_scrambled<256:0>, from a group of four 66-bit blocks, tx_coded_j<65:0> where j=0 to 3. For each group of four 66-bit blocks, j=3 corresponds to the most recently received block. Bit 0 in each 66-bit block is the first bit received and corresponds to the first bit of the synchronization header.

Tx_scrambled data 1506 corresponds to the tx_scrambled<256:0> output from transcoder block 1502. Tx_scrambled data 1506 is processed by an alignment block 1508 to generate message 1222. As described above, message 1222 is encoded by RS-encoder 1224, which outputs an encoded codeword 1226 that is provided as an input to symbol distribution block 1228. Symbol distribution block outputs 4 PMA requests using 4 FEC lanes, as depicted by PMA_UNITDATA_0.request, PMA_UNITDATA_1.request, PMA_UNITDATA_2.request, a PMA_UNITDATA_3.request. These data are provided as inputs to PMA bit Muxing block 1230 (in FIG. 12—not shown in FIG. 15).

Figure 16:
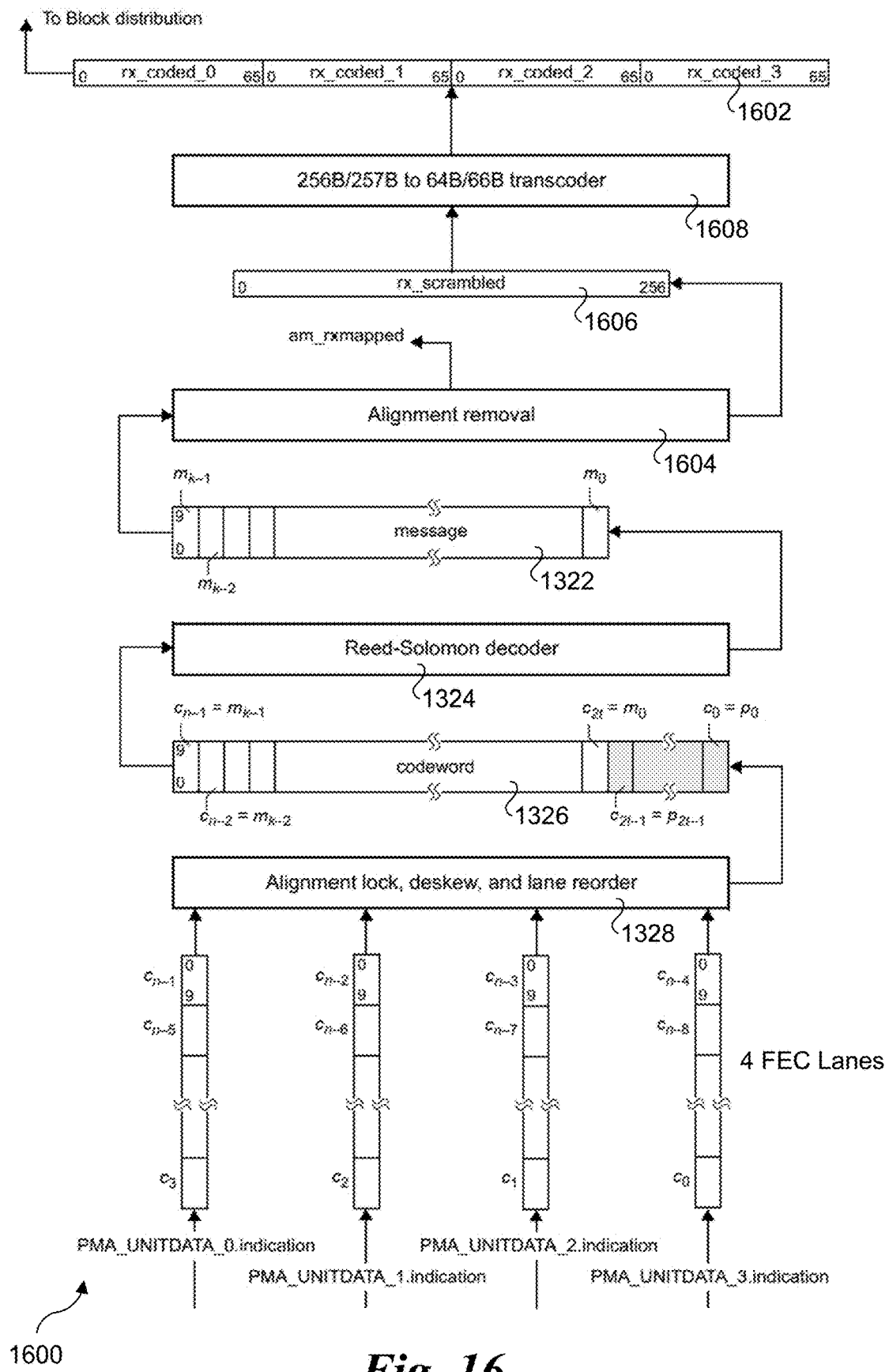
FIG. 16 is a diagram illustrating receive bit ordering implemented by the receiver as defined in IEEE std. 802.3-2018, Clause 91.

FIG. 16 is a reproduction of FIG. 91-7 from IEEE std. 802.3-2018 Clause 91, which illustrates receive bit ordering implemented by the receiver. In essence, the RX RS-FEC performs the inverse operations of the TX RS-FEC to reproduce the original TX 64B/66B coded data 1502, as depicted by RX 64B/66B coded data 1602. The process begins with 4 FEC lanes of PMA input data received from PMA bit Muxing block 1330 (see FIG. 13), as depicted by PMA_UNITDATA_0.indication, PMA_UNITDATA_1.indication, PMA_UNITDATA_2.indication, and PMA_UNITDATA_3.indication. These data are processed by symbol distribution block 1328, which performs alignment lock, deskew, and lane reorder functions to output codeword 1326. Codeword 1326 is then decoded by RS decoder 1324, which outputs message 1322. An alignment removal block 1604 performs alignment removal to output rx_scrambled data 1606 having 256B/257B encoding. rx_scrambled data 1606 is then transcoded from 256B/257B encoding back to 4 66-bit blocks having 64B/66B encoding by 256B/257B to 64B/66B transcoder 1608, which outputs the 4 66-bit blocks comprising RX 64B/66B coded data 1602.

In one aspect, non-interleaved RS-FEC is a 100G FEC based on the foregoing IEEE std. 802.3-2018 Clause 91 RS-FEC with interleaved codewords. Accordingly, it shares some of the same functional blocks as the Clause 91 RS-FEC, as shown by like-numbered components in FIGS. 14-18. For example, in the interleaved RS-FEC transmit bit ordering diagram of FIG. 17, the TX 64B/66B coded data 1502, 64B/66B to 256B/257B transcoder 1504, and tx_scrambled data 1506 are the same as shown in FIG. 15 and described above. Similarly, in the RS-FEC receive bit ordering diagram of FIG. 18, the RX 64B/66B coded data 1602, 256B/257B to 64B/66B transcoder 1608, and rx_scrambled data 1606 are the same as shown in FIG. 16 and discussed above. Accordingly, the following descriptions of the interleaved RS-FEC focuses on the differences relative to the non-interleaved RS FEC of FIGS. 14-16.

With reference to FIG. 17, tx_scrambled data 1506 is received by an AM insertion block 1702 that outputs tx_scrambled_am data that is received by 10-bit round robin distribution 1232. The process for RS encoding message A 1234 and message B 1240 are similar to processing a message using the Clause 91 RS-FEC described above, but uses separate RS encoders 1236 and 1242 to produce codewords 1238 and 1244. These are input to a Mux and 10-bit symbol distribution block 1246, which outputs 4 PMA requests using 4 FEC lanes, as depicted by PMA_UNITDATA_0.request, PMA_UNITDATA_1.request, PMA_UNITDATA_2.request, and PMA_UNITDATA_3.request. These data are provided as inputs to PMA bit Muxing block 1248 (see FIG. 12).

With reference to FIG. 18, 4 FEC lanes of PMA input data received from PMA bit Muxing block 1348 (see FIG. 13), as depicted by PMA_UNITDATA_0.indication, PMA_UNITDATA_1.indication, PMA_UNITDATA_2.indication, and PMA_UNITDATA_3.indication, are provided as input data to an alignment lock, deskew, and lane reorder block 1802. Data output from alignment lock, deskew, and lane reorder block 1802 is de-interleaved using a de-interleave block 1804, which outputs codeword 1338 and codeword 1344. As discussed above in FIG. 13, RS decoder 1336 is used to decode codeword 1338 to produce message A 1334, while RS decoder 1342 is used to decode codeword 1344 to produce message B 1340. 10-bit post FEC interleave block 1332 is used to interleave data from message A 1334 and message B 1340, outputting rx_scrambled_am data to which alignment removal is applied by an alignment removal block 1806, which outputs rx_scrambled data 1606 having 256B/257B encoding. rx_scrambled data 1606 is then transcoded from 256B/257B encoding back to 4 66-bit blocks having 64B/66B encoding by 256B/257B to 64B/66B transcoder 1608, which outputs the 4 66-bit blocks comprising RX 64B/66B coded data 1602.

Exemplary Implementation Environment and Blade Server Architecture

It is envisioned that aspects of the embodiments herein may be implemented in various types of computing and networking equipment, such as switches, routers and blade servers such as those employed in a data center and/or server farm environment. Typically, the servers used in data centers and server farms comprise arrayed server configurations such as rack-based servers or blade servers. These servers are interconnected in communication via various network provisions, such as partitioning sets of servers into LANs with appropriate switching and routing facilities between the LANs to form a private Intranet. For example, cloud hosting facilities may typically employ large data centers with a multitude of servers.

As an overview, typical blade server components and systems are shown in FIGS. 19*a-c*, and 20. Under a typical configuration, a rack-mounted chassis 1900 is employed to provide power and communication functions for a plurality of server blades (i.e., blades) 1902, each of which occupies a corresponding slot. (It is noted that all slots in a chassis do not need to be occupied.) In turn, one or more chassis 1900 may be installed in a blade server rack 1903 shown in FIG. 19*c*. Each blade is coupled to an interface plane 1904 (i.e., a backplane or mid-plane) upon installation via one or more mating connectors. Typically, the interface plane will include a plurality of respective mating connectors that provide power and communication signals to the blades. Under current practices, many interface planes provide "hot-swapping" functionality—that is, blades can be added or removed ("hot-swapped") on the fly, without taking the entire chassis down through appropriate power and data signal buffering.

Figure 19A:
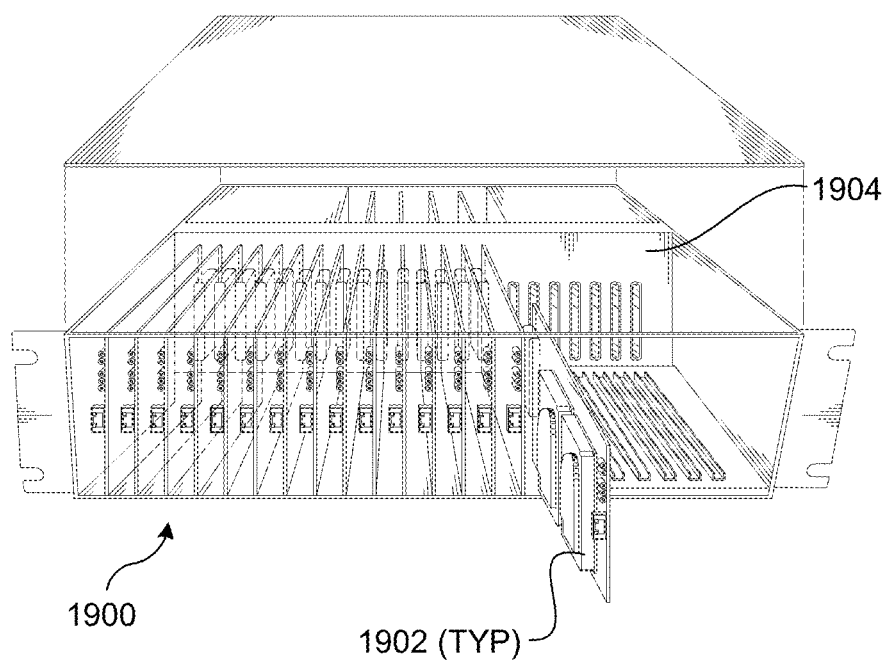
FIG. 19a is a frontal isometric view of an exemplary blade server chassis in which a plurality of server blades are installed.
Figure 19B:
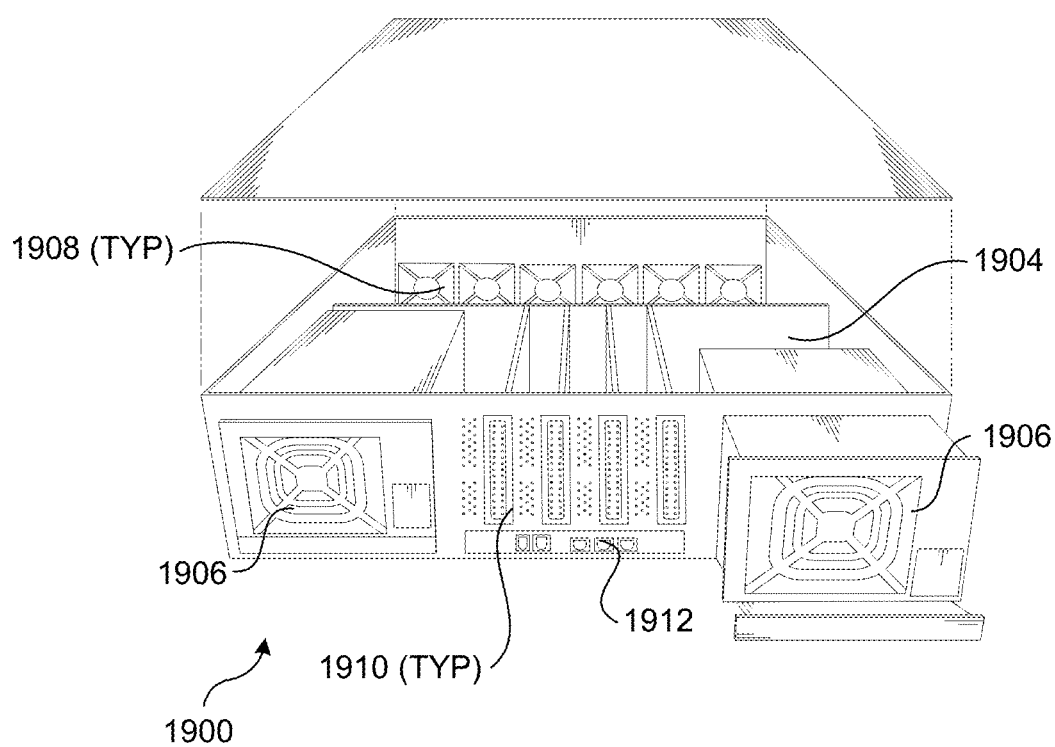
Figure 19C:
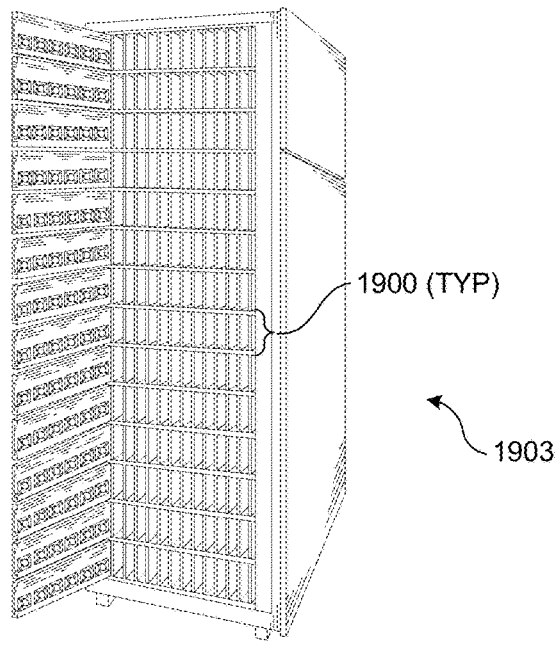
FIG. 19c is an isometric frontal view of an exemplary blade server rack in which a plurality of rack-mounted blade server chassis corresponding to FIGS. 19a and 19b are installed.

A typical mid-plane interface plane configuration is shown in FIGS. 19*a* and 19*b*. The backside of interface plane 1904 is coupled to one or more power supplies 1906. Oftentimes, the power supplies are redundant and hot-swappable, being coupled to appropriate power planes and conditioning circuitry to enable continued operation in the event of a power supply failure. In an optional configuration, an array of power supplies may be used to supply power to an entire rack of blades, wherein there is not a one-to-one power supply-to-chassis correspondence. A plurality of cooling fans 1908 are employed to draw air through the chassis to cool the server blades.

An important feature required of all blade servers is the ability to communicate externally with other IT infrastructure. This is typically facilitated via one or more network connect cards 1910, each of which is coupled to interface plane 1604. Generally, a network connect card may include a physical interface comprising a plurality of network port connections (e.g., a 100Gbe port), or may comprise a high-density connector designed to directly connect to a network device, such as a network switch, hub, or router.

Blade servers usually provide some type of management interface for managing operations of the individual blades. This may generally be facilitated by a built-in network or communication channel or channels. For example, one or more buses for facilitating a "private" or "management" network and appropriate switching may be built into the interface plane, or a private network may be implemented through closely-coupled network cabling and a network. Optionally, the switching and other management functionality may be provided by a management switch card 1912 that is coupled to the backside or frontside of the interface plane. As yet another option, a management or configuration server may be employed to manage blade activities, wherein communications are handled via standard computer networking infrastructure, for example, Ethernet.

Figure 20:
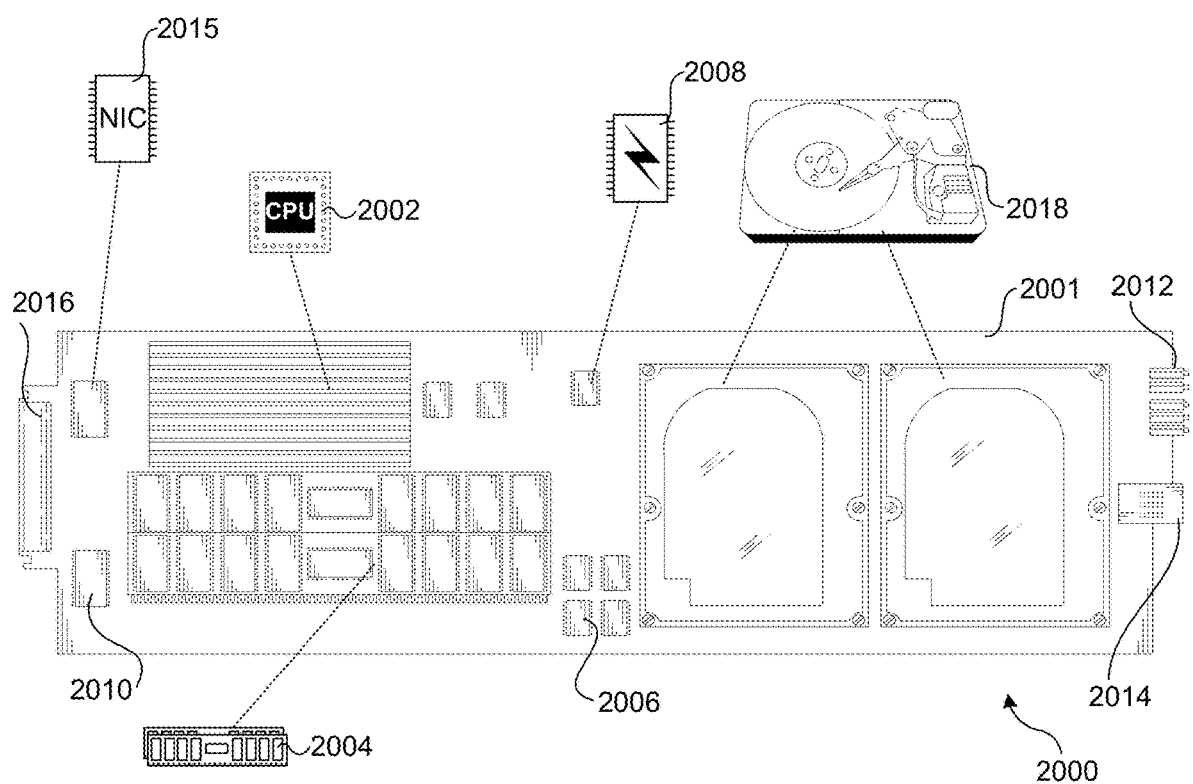
FIG. 20 shows details of the components of a typical server blade, according to one embodiment.

With reference to FIG. 20, further details of an exemplary blade 2000 are shown. As discussed above, each blade comprises a separate computing platform that is configured to perform server-type functions, i.e., is a "server on a card." Accordingly, each blade includes components common to conventional servers, including a main printed circuit board (main board) 2001 providing internal wiring (i.e., buses) for coupling appropriate integrated circuits (ICs) and other components mounted to the board. These components include one or more processors 2002 coupled to system memory 2004 (e.g., some form of Random Access Memory (RAM)), cache memory 2006 (e.g., SDRAM), and a firmware storage device 2008 (e.g., flash memory). A NIC (network interface controller) chip 2010 is provided for supporting conventional network communication functions, such as to support communication between a blade and external network infrastructure. Other illustrated components include status LED (light-emitting diodes) 2012, a set of console ports 2014 (only one of which is shown for simplicity), and a NIC 2015 coupled to an interface plane connector 2016. Additional components include various passive components (i.e., resistors, capacitors), power conditioning components, and peripheral device connectors.

Generally, each blade 2000 may also provide on-board storage. This is typically facilitated via one or more built-in disk controllers and corresponding connectors to which one or more disk drives 2018 or other type of non-volatile mass storage devices are coupled such a SSDs (solid-state drives). For example, typical disk controllers include SATA controllers, SCSI controllers, and the like. As an option, the disk drives/mass storage devices may be housed separate from the blades in the same or a separate rack, such as might be the case when a network-attached storage (NAS) appliance or backend storage sub-system that is employed for storing large volumes of data or under rack architectures employ disaggregated architectures, such as Intel® Corporation's Rack Scale Design, wherein compute resources and storage resources may reside in separate drawers coupled via a high-speed fabric such as a fabric employing 100GBASE-CR1 links.

NIC 2010 comprises circuitry and logic for facilitating corresponding networking operations, such as support for physical layer (L1) and data link layer operations (L2). Typically, upper layer operations are facilitated by an operating system network stack that would be hosted by an operating system running on processor 2002. However, in some embodiments, a NIC may employ its own network stack via embedded logic or the like.

In a typical data center deployment, network switching elements comprise rack-mounted equipment, such as would occupy a 1U, 2U, or 4U slot, or may be implemented via one or more server blades. Optionally, a network switching element may be implemented use one or more server blades.

NIC 2015 comprises circuitry and logic for implementing high-speed communication between multiple blades 2000 via interface plane 1904. In one embodiment, NIC 2015 is configured to implement signaling and logic corresponding to the 100 Gbps embodiments disclosed herein, including circuitry and logic for implementing a 100GBASE-CR1 port and associated link training operations. To further facilitate inter-blade communication over the 100GBASE-CR1 PHY, interface plane 1904 includes appropriate connectors, circuitry and wiring for facilitating the physical media aspect of the PHY (wiring not shown). For example, the circuitry may comprise connectors and wiring for facilitating signaling over 2 differential pairs in accordance with the configuration shown in FIG. 1.

In general, aspects of the link training embodiments disclosed herein may be implemented hardware (via, e.g., embedded logic), or via a combination of hardware and software. For example, a network element may include a processor running a software-based network stack and associated logic implemented via software for performing aspects of the operations described herein. Optionally, similar logic could be implemented via embedded logic in a NIC, large-scale network interface, or the like.

In addition to implementation in a blade server, the principles and teachings herein may be implemented via other types of equipment, such as telecommunications routers and switches. For example, a typical telecom switch comprises a rack with multiple cards coupled to a backplane, wherein the cards are generally analogous to the blades and the backplane is analogous to the interface plane in a blade server. Accordingly, the cards would be configured with circuitry and logic for implemented 100GBASE-CR1 ports, and the backplane would include connectors, circuitry, and wiring for facilitating the physical media aspect of the 100GBASE-KR1 PHY.

Figure 21:
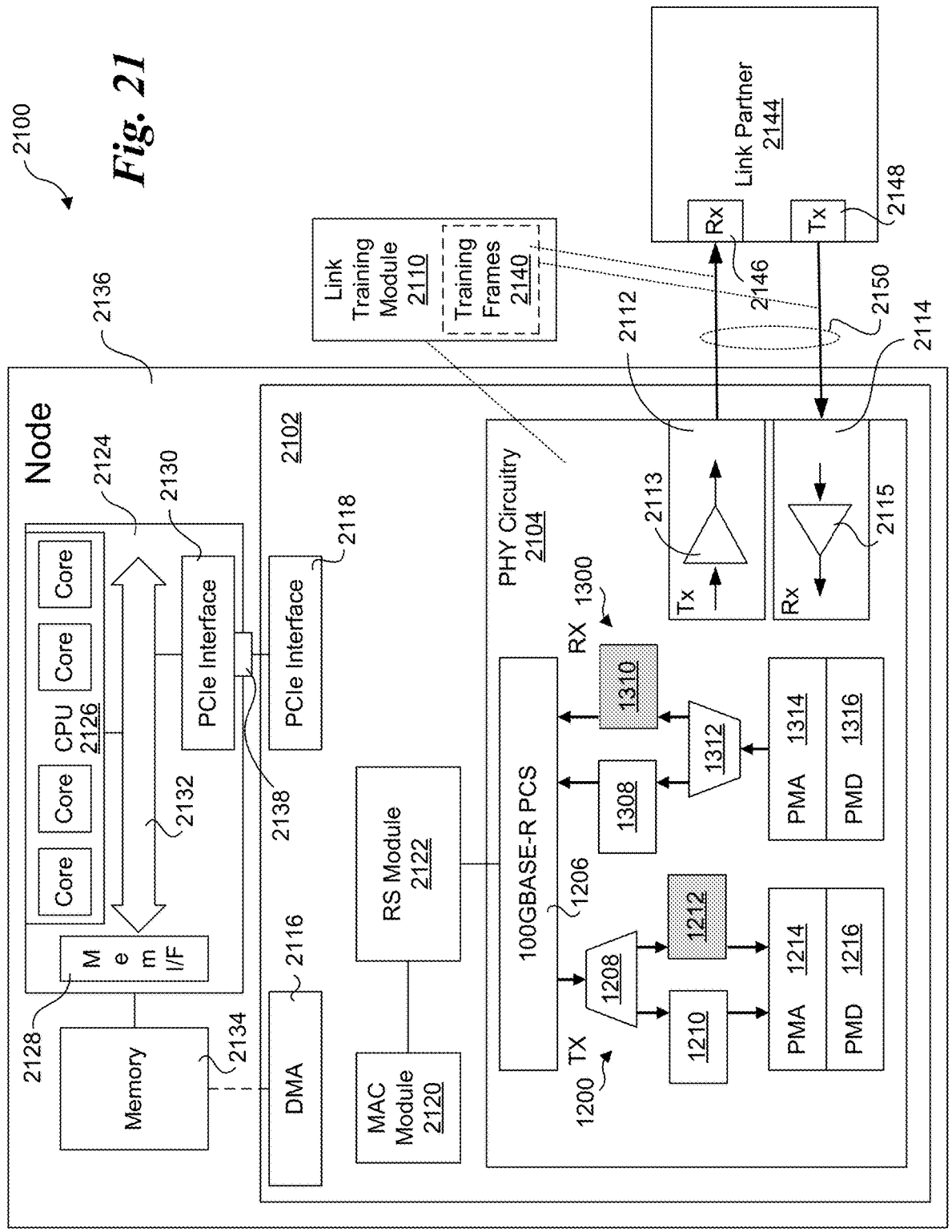
FIG. 21 is a schematic diagram illustrating an architecture for a network node employing a network chip configured to perform link training and link configuration operations in accordance with the embodiments disclosed herein.

FIG. 21 shows an architecture 2100 for a network node employing a network chip 2102 configured to perform link training and initialization operations in accordance with aspects of the embodiments disclosed herein. In the illustrated embodiment, network chip 2102 includes PHY circuitry 2104, which comprises circuitry for implementing hybrid TX PHY 1200 and hybrid RX PHY 1300, wherein both the hybrid TX and RX PHYs share a 100GBASE-R PCS 1206. Under an alternative configuration, the circuitry for each of hybrid TX PHY 1200 and hybrid RX PHY 1300 have a separate 100GBASE-R PCS PHY, such as shown in FIGS. 12 and 13. PHY circuitry 2104 also includes circuitry for implementing a link training module 2110, a transmitter port 2112 including transmitter circuitry 2113 and a receiver port 2114 including receiver circuitry 2115.

In addition to PHY circuitry 2104, network chip 2102 further includes a DMA (Direct Memory Access) interface 2116, an input-output (IO) interface comprising a Peripheral Component Interconnect Express (PCIe) interface 2118, a MAC module 2120 and a Reconciliation Sublayer (RS) module 2122 coupled to 100GBASE-R PCS.

Network node 2100 also comprises a System on a Chip (SoC) 2124 including a Central Processing Unit (CPU) 2126 having one or more processor cores, coupled to a memory interface 2128 and a PCIe interface 2130 via an interconnect 2132. Memory interface 2128 is further depicted as being coupled to memory 2134. In one embodiment, DMA block 2116 is configured to implement DMA operations using PCIe DMA transactions transmitted over PCIe interface 2118, enabling DMA block 2116 to directly access memory 2134. Under a typical configuration, network chip 2102, SoC 2124 and memory 2134 will be mounted on or otherwise operatively coupled to a circuit board 2136 that includes wiring traces for coupling these components in communication, as depicted by single lines connecting PCIe interface 2118 to PCIe interface 2130 at a PCIe port 2138 and SoC 2124 to memory 2134.

In one embodiment, MAC module 2120 is configured to implement aspects of the MAC layer operations defined by applicable IEEE 802.3 draft and final standards. Similar, RS module 2122 is configured to implement reconciliation sub-layer operations defined by applicable IEEE 802.3 draft and final standards.

Link training module 2110 is further depicted as including training frames 2140, which are configured in accordance with the training frame embodiments disclosed herein. During link training, training frames 2140 are exchanged with a link partner, as depicted by a link partner 2144 including a receiver port 2146 and a transmitter port 2148. In one embodiment the configuration of node 2100 and link partner 2144 are similar. Link training module 2110 is further configured to perform link training operations relating to initialization for a link 2150 communicatively coupled between network chip 2102 and link partner 2144 in accordance with aspects of the embodiments disclosed herein.

In one embodiment, network chip 2102 comprises a 100 Gbps Ethernet Network Interface Controller (NIC) chip having an interface including 100GBASE-CR1 TX and RX ports. However, the circuitry and components of network chip 2102 may also be implemented in other types of chips and components, including SoCs, multi-chip modules, and NIC chips including support for multiple network interfaces (e.g., wired and wireless). For example, in one embodiment, network chip 2102 is implemented as a multi-chip module including a hybrid PHY chip implementing PHY circuitry 2104.

Network chip 1202 or a multi-chip module including a PHY chip implementing PHY circuitry 2104 may also be configured to support a 100GBASE-KR1 link and interface.

For example, such a network chip or multi-chip module may be implemented for devices in FIG. 6.

In general, the circuitry, logic and components depicted in the figures herein may be implemented in various types of integrated circuits (e.g., semiconductor chips) and modules, including discrete chips, SoCs, multi-chip modules, and networking/link interface chips including support for multiple network interfaces. Also, as used herein, circuitry and logic to effect various operations may be implemented via one or more of embedded logic, embedded processors, controllers, microengines, or otherwise using any combination of hardware, software, and/or firmware. For example, the operations depicted by various logic blocks and/or circuitry may be effected using programmed logic gates and the like, including but not limited to Application Specific Integrated Circuits (ASICs), FPGAs, IP block libraries, or through one or more of software or firmware instructions executed on one or more processing elements including processors, processor cores, controllers, microcontrollers, microengines, etc.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Various aspects of the embodiments herein may be facilitated by corresponding software and/or firmware components and applications, such as software and/or firmware executed by an embedded processor or the like. Thus, embodiments of this invention may be used as or to support a software program, software modules, firmware, and/or distributed software executed upon some form of processor, processing core or embedded logic a virtual machine running on a processor or core or otherwise implemented or realized upon or within a non-transitory computer-readable or machine-readable storage medium. A non-transitory computer-readable or machine-readable storage medium includes any mechanism for storing or transmitting information in a form readable by a machine (e.g., a computer). For example, a non-transitory computer-readable or machine-readable storage medium includes any mechanism that provides (i.e., stores and/or transmits) information in a form accessible by a computer or computing machine (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A non-transitory computer-readable or machine-readable storage medium may also include a storage or database from which content can be downloaded. The non-transitory computer-readable or machine-readable storage medium may also include a device or product having content stored thereon at a time of sale or delivery. Thus, delivering a device with stored content, or offering content for download over a communication medium may be understood as providing an article of manufacture comprising a non-transitory computer-readable or machine-readable storage medium with such content described herein.

The operations and functions performed by various components described herein may be implemented by software running on a processing element, via embedded hardware or the like, or any combination of hardware and software. Such components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration information, etc.) may be provided via an article of manufacture including non-transitory computer-readable or machine-readable storage medium, which provides content that represents instructions that can be executed. The content may result in a computer performing various functions/operations described herein.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method for operating a high-speed Ethernet link coupled between first and second link partners, each link partner implementing a Physical Layer (PHY) including a non-interleaved Reed-Solomon Forward Error Correction (RS-FEC) sublayer and an interleaved RS-FEC sublayer for each of a transmitter and receiver, comprising:
at the first link partner, while in link training determining a FEC mode to implement for the receiver of the first link partner during a DATA mode for the link, the FEC mode comprising a non-interleaved FEC mode that employs the non-interleaved RS-FEC sublayer or an interleaved FEC mode that employs the interleaved RS-FEC sublayer;
exchanging training frames between the first link partner and the second link partner identifying a FEC mode to be used for data transmitted from the transmitter of the second link partner to the receiver of the first link partner during the DATA mode; and
configuring the PHY for the transmitter of the second link partner and the PHY for the receiver of the first link partner to implement the FEC mode that is identified.

2. The method of claim 1, further comprising:
at the first link partner,
transmitting a first training frame to the second link partner including a control field containing indicia indicating the first link partner is requesting to use an interleaved FEC mode or a non-interleaved FEC mode;
at the second link partner;
receiving the first training frame and determining whether the first training frame includes a control field containing indicia identifying a FEC mode;
when the control field indicia indicate the first link partner is requesting to use the interleaved FEC mode,
transmitting a second training frame to the first link partner include a status field having indicia echoing the interleaved mode;
when the control field indicia indicate the first link partner is requesting to use the non-interleaved FEC mode;
transmitting a second training frame to the first link partner include a status field having indicia echoing the non-interleaved FEC mode.

3. The method of claim 2, further comprising:
prior to transitioning from link training to the link data mode,
when the status field indicia of the second training frame echoes the interleaved FEC mode,
configuring the PHY of the second link partner to use the interleaved RS-FEC sublayer for transmitting data to the first link partner during link data mode; and
configuring the PHY of the first link partner to use the interleaved RS-FEC sublayer for receiving data from the second link partner during the link data mode;
when the status field indicia of the second training frame echoes the non-interleaved FEC mode,
configuring the PHY of the second link partner to use the non-interleaved RS-FEC sublayer for transmitting data to the first link partner during link data mode; and
configuring the PHY of the first link partner to use the non-interleaved RS-FEC sublayer for receiving data from the second link partner during the link data mode.

4. The method of claim 1, further comprising:
at the second link partner, while in link training determining a FEC mode to implement for the receiver of the second link partner during the DATA mode for the link, the FEC mode comprising the non-interleaved FEC mode or the interleaved FEC mode;
exchanging training frames between the second link partner and the first link partner identifying a FEC mode to be used for data transmitted from the transmitter of the first link partner to the receiver of the second link partner during the DATA mode; and
configuring the PHY for the transmitter of the first link partner and the PHY for the receiver of the second link partner to implement the FEC mode that is identified.

5. The method of claim 1, further comprising:
while in a link training phase, determining whether the receiver for the first partner is likely to see decision feedback equalizer (DFE) burst errors,
when it is determined that the receiver of the first link partner is likely to see DFE burst errors, transmitting a training frame to the second link partner including a control field containing indicia indicating the first link partner is requesting to use the interleaved FEC mode; otherwise
transmitting a training frame to the second link partner including a control field containing indicia indicating the first link partner is requesting to use the non-interleaved FEC mode.

6. The method of claim 1, wherein the high-speed Ethernet link is a 100GBASE-CR1 Ethernet link.

7. The method of claim 1, wherein the high-speed Ethernet link is a 100GBASE-KR1 Ethernet link.

8. The method of claim 1, wherein the PHY for the transmitter (TX) of each of the first and second link partners includes:
a Physical Coding Sublayer (PCS);
a non-interleaved TX RS-FEC sublayer;
an interleaved TX RS-FEC sublayer; and
a multiplexer to selectively couple an output of the PCS to an input of the non-interleaved TX RS-FEC sublayer or to an input of the interleaved TX RS-FEC sublayer.

9. The method of claim 1, wherein the PHY for the receiver (RX) of each of the first and second link partners includes:
a non-interleaved RX RS-FEC sublayer;
an interleaved RX RS-FEC sublayer;
a Physical Coding Sublayer (PCS); and
a multiplexer to selectively couple an input of the PCS to an output of the non-interleaved RX RS-FEC sublayer or to an output of the interleaved RX RS-FEC sublayer.

10. An apparatus including a high-speed Ethernet interface having a transmitter (TX) including a TX Physical Layer (PHY) and a receiver (RX) including an RX PHY, each of the TX and RX PHY including a non-interleaved Reed-Solomon Forward Error Correction (RS-FEC) sublayer and an interleaved RS-FEC sublayer, the apparatus to be implemented as a first link partner coupled to a second link partner via a high-speed Ethernet link and configured to:
  while in a link training mode with the second link partner, determine a FEC mode to implement for the receiver during a DATA mode for the link, the FEC mode comprising a non-interleaved FEC mode that employs the non-interleaved RS-FEC sublayer or an interleaved FEC mode that employs the interleaved RS-FEC sublayer;
  exchange training frames with the second link partner identifying the FEC mode is to be used for data transmitted from a transmitter of the second link partner to the receiver during the DATA mode; and
  when the FEC mode is the non-interleaved FEC mode, configure the PHY for the receiver to employ the non-interleaved RS-FEC sublayer;
  when the FEC mode is the interleaved FEC mode, configure the PHY for the receiver to employ the interleaved RS-FEC sublayer.

11. The apparatus of claim 10, wherein the apparatus is further configured to:
  transmit a first training frame to the second link partner including a control field containing a FEC mode request indicating the apparatus is requesting to use an interleaved FEC mode or a non-interleaved FEC mode; and
  receive a second training frame transmitted from the second link partner including a status field having indicia echoing the FEC mode request.

12. The apparatus of claim 11, wherein the apparatus is further configured to:
  prior to transitioning from the link training mode to the DATA mode,
    when the status field indicia of the second training frame echo the interleaved FEC mode, configure the RX PHY to use the interleaved RS-FEC sublayer during the DATA mode; or
    when the status field indicia of the second training frame echo the non-interleaved FEC mode, configure the RX PHY to use the non-interleaved RS-FEC sublayer during the DATA mode.

13. The apparatus of claim 10, wherein the apparatus is further configured to:
  exchange training frames with the second link partner identifying a FEC mode to be used for data transmitted from the transmitter to a receiver of the second link partner during the DATA mode; and
  configure the TX PHY to implement the FEC mode that is identified.

14. The apparatus of claim 12, wherein the apparatus is further configured to:
  receive a first training frame transmitted from the second link partner and determining whether the first training frame includes a control field containing a FEC mode request identifying a FEC mode to be used for transmission of data to a receiver of the second link partner during the DATA mode;
  when the FEC mode request is the interleaved FEC mode, transmit a second training frame to the second link partner including a status field echoing the interleaved mode;
  when the FEC mode request is the non-interleaved FEC mode,
    transmit a second training frame to the second link partner including a status field echoing the interleaved mode.

15. The apparatus of claim 10, wherein the apparatus is further configured to:
  while in the link training mode, determine whether the receiver is likely to see decision feedback equalizer (DFE) burst errors,
  when it is determined that the receiver is likely to see DFE burst errors, transmit a training frame to the second link partner including a control field containing indicia indicating the first link partner is requesting to use the interleaved FEC mode; otherwise
  transmits a training frame to the second link partner including a control field containing indicia indicating the first link partner is requesting to use the non-interleaved FEC mode.

16. The apparatus of claim 10, wherein the high-speed Ethernet link is a 100GBASE-CR1 Ethernet link.

17. The apparatus of claim 10, wherein the high-speed Ethernet link is a 100GBASE-KR1 Ethernet link.

18. The apparatus of claim 10, wherein the TX PHY comprises:
  a Physical Coding Sublayer (PCS);
  a non-interleaved TX RS-FEC sublayer;
  an interleaved TX RS-FEC sublayer; and
  a multiplexer to selectively couple an output of the PCS to an input of the non-interleaved TX RS-FEC sublayer or to an input of the interleaved TX RS-FEC sublayer.

19. The apparatus of claim 10, wherein the RX PHY comprises:
  a non-interleaved RX RS-FEC sublayer;
  an interleaved RX RS-FEC sublayer;
  a Physical Coding Sublayer (PCS); and
  a multiplexer to selectively couple an input of the PCS to an output of the non-interleaved RX RS-FEC sublayer or to an output of the interleaved RX RS-FEC sublayer.

20. The apparatus of claim 10, wherein the apparatus comprises a PHY chip.

21. An apparatus comprising:
  a receiver (RX);
  a transmitter (TX);
  Physical Layer (PHY) circuitry, including,
    a Physical Coding Sublayer (PCS);
    a non-interleaved TX RS-FEC sublayer;
    an interleaved TX RS-FEC sublayer; and
    a multiplexer to selectively couple an output of the PCS to an input of the non-interleaved TX RS-FEC sublayer or to an input of the interleaved TX RS-FEC sublayer;
    a first Physical Medium Attachment (PMA) sublayer, having an input coupled to the non-interleaved TX RS-FEC sublayer and the interleaved TX RS-FEC sublayer,
    a first Physical Medium Dependent (PMD) sublayer, coupled to the first PMA sublayer;
    a second PMD sublayer;
    a second PCS sublayer;
    a non-interleaved TX RS-FEC sublayer coupled to the second PCS sublayer;
    an interleaved TX RS-FEC sublayer coupled to the second PCS sublayer; and
    a multiplexer to selectively couple an output of the PCS to an input of the non-interleaved TX RS-FEC sublayer or to an input of the interleaved TX RS-FEC sublayer.

22. The apparatus of claim 21, further comprising:
a first Auto-Negotiation (AN) sublayer, coupled to the first PMD sublayer;
a first media depending interface (MDI), coupled between the first AN sublayer and the transmitter;
a second Auto-Negotiation (AN) sublayer, coupled to the first PMD sublayer;
a second media depending interface (MDI), coupled between the first AN sublayer and the receiver.

23. The apparatus of claim 22, wherein the apparatus is a 100GBASE-CR1 PHY chip.

24. The apparatus of claim 22, wherein the apparatus is a 100GBASE-KR1 PHY chip.

25. That apparatus of claim 21, further comprising:
an RS module comprising circuitry to implement a reconciliation sublayer, coupled to the PCS sublayer;
a Media Access Channel module comprising circuitry to implement a MAC sublayer, coupled to the RS module; and
an Input-Output (IO) interface.

\* \* \* \* \*